United States Patent
Takenaka et al.

(10) Patent No.: US 7,632,480 B2
(45) Date of Patent: Dec. 15, 2009

(54) THERMAL EXPANSION INHIBITOR, ZERO THERMAL EXPANSION MATERIAL, NEGATIVE THERMAL EXPANSION MATERIAL, METHOD FOR INHIBITING THERMAL EXPANSION, AND METHOD FOR PRODUCING THERMAL EXPANSION INHIBITOR

(75) Inventors: Koshi Takenaka, Wako (JP); Hidenori Takagi, Wako (JP)

(73) Assignee: Riken, Saitama (JP)

( * ) Notice: Subject to any disclaimer, the term of this patent is extended or adjusted under 35 U.S.C. 154(b) by 5 days.

(21) Appl. No.: 11/658,740

(22) PCT Filed: Jul. 29, 2005

(86) PCT No.: PCT/JP2005/013914

§ 371 (c)(1),
(2), (4) Date: Oct. 2, 2007

(87) PCT Pub. No.: WO2006/011590

PCT Pub. Date: Feb. 2, 2006

(65) Prior Publication Data

US 2009/0004087 A1    Jan. 1, 2009

(30) Foreign Application Priority Data

Jul. 30, 2004   (JP)   ............... 2004-224431
Jan. 26, 2005   (JP)   ............... 2005-018311

(51) Int. Cl.
  *C09K 3/00*   (2006.01)
  *G02B 5/18*   (2006.01)
(52) U.S. Cl. ............ 423/409; 423/324; 423/351; 423/371; 423/385; 252/70; 252/380

(58) Field of Classification Search ............ 501/32; 423/351, 363, 409; 428/623; 252/70, 380
See application file for complete search history.

(56) References Cited

FOREIGN PATENT DOCUMENTS

| | | |
|---|---|---|
| JP | 56-98195 A | 8/1981 |
| JP | 7-36286 U | 7/1995 |
| JP | 2003-146693 A | 5/2003 |
| JP | 2003-192385 A | 7/2003 |

OTHER PUBLICATIONS

Aoki, M.; Yamane, H.; Shimada, B.; Kajiwara, K.; "Single Crystal Growth of manganese gallium nitride using Mn-Ga-Ge Melt" J. Alloys and Cmpds; 364 (2004). 280-282.*

Fong, C.Y.; Gubanov, Y.A.; Boekema, C; "Iron and Manganese Doped Zinc-Blende GaN". J. Electronic Materials. 29(9), 2067-1073. 2000.*

Bouchaud, Ann Chim., vol. 3, pp. 81-105 (1968).

Fruchart, D., et al., Proc. Intern. Conf. Magn., vol. 4, pp. 572-576 (1974).

(Continued)

*Primary Examiner*—Stuart Hendrickson
*Assistant Examiner*—Richard M Rump
(74) *Attorney, Agent, or Firm*—Birch Stewart Kolasch & Birch, LLP

(57) ABSTRACT

Provided is a thermal expansion inhibitor which has a much broader application range and which can be used with ease.

Used is a thermal expansion inhibitor comprising a manganese nitride crystal.

13 Claims, 13 Drawing Sheets

OTHER PUBLICATIONS

Ph. L'Heritier et al., Mat. Res. Bull., vol. 14, pp. 1089-1095 (1979).

Kim, W.S., et al., Phys. Rev. B vol. 68, pp. 1072402-1-1072402-4 (2003).

White, G.K., et al., J. Low Temp. Phys., vol. 7, pp. 43-75 (1972).

White, G.K., et al., J. Phys. D: Appl. Phys., vol. 6, pp. 2070-2078 (1973).

Heritier et al., Materials Research Bulletin, 14, 1203-1212, (1979).

Garcia et al., The Journal of Chemical Thermodynamics, 15, 1041-1057, (1983).

* cited by examiner

THERMAL EXPANSION INHIBITOR, ZERO THERMAL EXPANSION MATERIAL, NEGATIVE THERMAL EXPANSION MATERIAL, METHOD FOR INHIBITING THERMAL EXPANSION, AND METHOD FOR PRODUCING THERMAL EXPANSION INHIBITOR

This application is the national stage of International Application PCT/JP2005/013914, filed Jul. 29, 2005, which claims priority under 35 USC §119(a) of Japanese Application No. 2005-18311, filed Jan. 26, 2005 and of Japanese Application No. 2004-224431, filed Jul. 30, 2004.

TECHNICAL FIELD

The present invention relates to a thermal expansion inhibitor for inhibiting thermal expansion to be caused by an increase in temperature, a zero thermal expansion material or a negative thermal expansion material containing the thermal expansion inhibitor, a method for inhibiting thermal expansion, and a method for producing a thermal expansion inhibitor.

BACKGROUND ART

In general, it is known that a substance undergoes thermal expansion with increasing temperature. Accordingly, there may occur various problems with parts to be used in devices that are exposed to temperature change.

Accordingly, various methods for inhibition of thermal expansion at different temperatures have heretofore been investigated. For example, JP-A 2003-146693 describes use of ceramics or glass ceramics having a negative coefficient of linear thermal expansion of from $-1 \times 10^{-6}/°$C. to $-12 \times 10^{-6}/°$C. in a temperature range of $-40°$C. to $100°$C. As examples of such ceramics or glass ceramics, it shows ceramics or glass ceramics that comprise a β-quartz solid solution or a β-eucryptite solid solution as the main crystal thereof, or polycrystalline ceramics that comprise a phosphate tungstate or a tungstate containing at least any of Zr and Hf as the main crystal thereof.

In their practical use, however, they require various conditions and could not be a satisfactory thermal expansion inhibitor.

It has heretofore been known that a perovskite manganese nitride having a chemical formula $Mn_3XN$ (wherein X represents Ni, Zn, Ga or Ag) exhibits a phenomenon of such that the lattice in the low-temperature magnetic ordered phase expands with the formation of an antiferromagnetic order therein (magnetovolume effect) (J. P. Bouchaud et al., C.R. Acad. Sc. Paris C 262, 640 (1966); J. P. Bouchaud, Ann. Chim. 3, 81 (1968); D. Fruchart et al., Solid State Commun. 9, 1793 (1971); R. Fruchart et al., J. Phys. (Paris) 32, C1-982 (1971); D. Fruchart et al., Proc. Intern. Conf. Magn. 4, 572 (1974); Ph. l'Heritier et al., Mat. Res. Bull. 14, 1089 (1979); Ph. l'Heritier et al., Mat. Res. Bull. 14, 1203 (1979); W. S. Kim et al., Phys. Rev. B 68, 172402 (2003)). However, this phenomenon is a sharp first-order phase transition, and the transition width is within $1°$ C. and is narrow, and therefore the substance could not be put in practical use as an industrial thermal expansion inhibitor.

DISCLOSURE OF THE INVENTION

Problems that the Invention is to Solve

The present invention is to solve the above-mentioned problems, and its object is to provide a thermal expansion inhibitor which has a much wider application range than any other conventional thermal expansion inhibitors and which can be used with ease.

Means for Solving the Problems

We, the present inventors have assiduously studied and, as a result, have surprisingly found that atomic substitution in a manganese nitride results in gradual negative thermal expansion with a temperature range of $10°$ C. or wider, and have completed the present invention. Concretely, the invention includes the following:

(1) A thermal expansion inhibitor comprising a manganese nitride crystal.

(2) The thermal expansion inhibitor of (1), which comprises a perovskite manganese nitride crystal having negative thermal expansion over an at least $10°$ C. range.

(3) The thermal expansion inhibitor of (1), which comprises a manganese nitride crystal having a composition of the following formula (1), and which has negative thermal expansion over an at least $10°$ C. range:

$$Mn_{4-x}A_xB \qquad \text{Formula (1)}$$

wherein A is one kind of atom selected from Co, Ni, Cu, Zn, Ga, Rh, Pd, Ag, Cd, and In, and 0<x<4 but x is not an integer; or A consists of at least two kinds of atoms selected from Al, Si, Sc, and atoms of Groups 4A to 5B of 4th to 6th Periods of the Periodic Table, and at least one kind of the atoms is any of Co, Ni, Cu, Zn, Ga, Rh, Pd, Ag, Cd, and In, and 0<x<4; and B is a nitrogen atom, wherein some of B in the crystal may be substituted with a carbon atom or the like.

(4) The thermal expansion inhibitor of (3), wherein the formula (1) is shown by the following formula (2):

$$Mn_{3+x2}A^{21}_{y2}A^{22}_{1-x2-y2}B \qquad \text{Formula (2)}$$

wherein $A^{21}$ is one kind of atom selected from Co, Ni, Cu, Zn, Ga, Rh, Pd, Ag, Cd, and In, $A^{22}$ is one or more kinds of atoms selected from Al, Si, Sc, and atoms of Groups 4A to 5B of 4th to 6th Periods of the Periodic Table, in which $A^{21}$ and $A^{22}$ are not the same and are not Mn; $0 \leq x2 < 1$, $0 < y2 < 1$, and $1 > x2 + y2$; and B is a nitrogen atom, wherein some of B in the crystal may be substituted with a carbon atom or the like.

(5) The thermal expansion inhibitor of (1), which comprises a manganese nitride crystal having a composition of the following formula (2-2):

$$Mn_{3+x2}A^{21}_{y2}A^{22}_{1-x2-y2}B \qquad \text{Formula (2-2)}$$

wherein $A^{21}$ is one kind of atom selected from Co, Ni, Cu, Zn, Ga, Rh, Pd, Ag, Cd, and In, and $A^{22}$ is one kind of atom selected from Co, Ni, Cu, Zn, Ga, Rh, Pd, Ag, Cd, In, Ge, and Sn, in which $A^{21}$ and $A^{22}$ are not the same; $0 \leq x2 < 1$, $0.35 < y2 < 0.8$, and $1 > x2 + y2$; and B is a nitrogen atom, wherein some of B in the crystal may be substituted with a carbon atom or the like.

(6) The thermal expansion inhibitor of (1), which comprises a manganese nitride crystal having a composition of the following formula (2-3):

$$Mn_{3+x2}A^{21}_{y2}A^{22}_{1-x2-y2}B \qquad \text{Formula (2-3)}$$

wherein $A^{21}$ is one kind of atom selected from Ni, Cu, Zn, Ga, Ag, and In; $A^{22}$ is Ge or Sn; x2 is 0; 0.35<y2<0.8; and B is a nitrogen atom, wherein some of B in the crystal may be substituted with a carbon atom or the like.

(7) The thermal expansion inhibitor of (1), which comprises a manganese nitride crystal having a composition of the following formula (2-4):

$$Mn_{3+x2}A^{21}{}_{y2}A^{22}{}_{1-x2-y2}B \quad \text{Formula (2-4)}$$

wherein $A^{21}$ is one kind of atom selected from Ni, Cu, Zn, Ga, Ag, and In; $A^{22}$ is Ge or Sn; 0<x2<0.2; 0.35<y2<0.7; and B is a nitrogen atom, wherein some of B in the crystal may be substituted with a carbon atom or the like.

(8) The thermal expansion inhibitor of (3), wherein the formula (1) is shown by the following formula (3):

$$Mn_{3-x3}A^{31}{}_{y3}A^{32}{}_{1+x3-y3}B \quad \text{Formula (3)}$$

wherein $A^{31}$ is one kind of atom selected from Co, Ni, Cu, Zn, Ga, Rh, Pd, Ag, Cd, and In, $A^{32}$ consists of one or more kinds of atoms selected from Al, Si, Sc, and atoms of Groups 4A to 5B of 4th to 6th Periods of the Periodic Table, in which $A^{31}$ and $A^{32}$ are not the same and are not Mn; 0<x3<1, 0<y3<2, and 1+x3−y3>0; and B is a nitrogen atom, wherein some of B in the crystal may be substituted with a carbon atom or the like.

(9) The thermal expansion inhibitor of (1), which comprises a manganese nitride having a composition of the following formula (4):

$$Mn_{3-x4}A^{41}{}_{y4}A^{42}{}_{1-y4}A^{43}{}_{x4}B \quad \text{Formula (4)}$$

wherein $A^{41}$ is one kind of atom selected from Co, Ni, Cu, Zn, Ga, Rh, Pd, Ag, Cd, and In, $A^{42}$ is one kind of atom selected from Co, Ni, Cu, Zn, Ga, Rh, Pd, Ag, Cd, In, Ge, and Sn, in which $A^{41}$ and $A^{42}$ are not the same; $A^{43}$ is one kind of atom selected from Fe, Ta, Cr, and Nb; 0<x4<0.3, and 0.35<y4<0.8; and B is a nitrogen atom, wherein some of B in the crystal may be substituted with a carbon atom or the like.

(10) The thermal expansion inhibitor of (1), which comprises a manganese nitride having a composition of the following formula (4-2):

$$Mn_{3-x4}A^{41}{}_{y4}A^{42}{}_{1-y4}A^{43}{}_{x4}B \quad \text{Formula (4-2)}$$

wherein $A^{41}$ is one kind of atom selected from Ni, Cu, Zn, Ga, Ag, and In; $A^{42}$ is Ge or Sn; $A^{43}$ is one kind of atom selected from Fe or Ta; 0<x4<0.3, and 0.35<y4<0.8; and B is a nitrogen atom, wherein some of B in the crystal may be substituted with a carbon atom or the like.

(11) The thermal expansion inhibitor of (1), which comprises a manganese nitride having a composition of the following formula (5):

$$Mn_{4-x5}A^{51}{}_{x5}B \quad \text{Formula (5)}$$

wherein $A^{51}$ is one kind of atom selected from Ni, Cu, Zn, Ga, Ag, and In; 0.6<x5<1.3 but x5 is not 1; and B is a nitrogen atom, wherein some of B in the crystal may be substituted with a carbon atom or the like.

(12) The thermal expansion inhibitor of any of (1) and (3) to (11), wherein the manganese nitride has a perovskite structure.

(13) The thermal expansion inhibitor of (1), which comprises a perovskite manganese nitride obtainable by sintering at least two kinds of compounds shown by the following formula (10), and which has negative thermal expansion over an at least 10° C. range:

$$Mn_3A^1N \quad \text{Formula (10)}$$

wherein $A^1$ is one kind of atom selected from Al, Si, Sc, and atoms of Groups 4A to 5B of 4th to 6th Periods of the Periodic Table.

(14) The thermal expansion inhibitor of (1), which comprises a perovskite manganese nitride obtainable by sintering at least $Mn_2N$ and two or more kinds selected from the group consisting of Al, Si, Sc, atoms of Groups 4A to 5B of 4th to 6th Periods of the Periodic Table and their nitrides, and which has negative thermal expansion over an at least 10° C. range.

(15) The thermal expansion inhibitor of (1), which comprises a manganese nitride containing at least one kind of atom more effective for lattice thermal contraction than Ni, and at least one kind of atom more effective for broadening volume change caused by magnetic phase transition than Sn, and which has negative thermal expansion over an at least 10° C. range.

(16) The thermal expansion inhibitor of (15), wherein the manganese nitride further contains at least one kind of Fe, Ta, Cr, and Nb.

(17) The thermal expansion inhibitor of any one of (1) to (16), which has a coefficient of linear thermal expansion of from $-100 \times 10^{-6}$/° C. to $-3 \times 10^{-6}$/° C.

(18) The thermal expansion inhibitor of any one of (1) to (17), which has negative thermal expansion over an at least 15° C. range.

(19) The thermal expansion inhibitor of any one of (1) to (18), wherein the nitrogen atom in the manganese nitride is substituted with a carbon atom in a ratio of from more than 0 to 15%.

(20) A zero thermal expansion material containing a thermal expansion inhibitor of any one of (1) to (19).

(21) A negative thermal expansion material containing the thermal expansion inhibitor of any one of (1) to (19).

(22) A method for inhibiting thermal expansion, which comprises using the thermal expansion inhibitor of any one of (1) to (19).

(23) A method for producing a thermal expansion inhibitor, which comprises measuring a thermal expansion of a crystal having a composition of the following formula (10), measuring a thermal expansion of a crystal in which the constituent elements of the formula (10) are partially replaced by at least one kind of atom selected from Al, Si, Sc, and atoms of Groups 4A to 5B of 4th to 6th Periods of the Periodic Table, wherein when the atom is a single kind, then the atom is not Mn or $A^1$, and selecting the condition of a crystal composition capable of having negative thermal expansion over an at least 10° C. range, from those thermal expansion data:

$$Mn_3A^1N \quad \text{Formula (10)}$$

wherein $A^1$ is one kind of atom selected from Al, Si, Sc, and atoms of Groups 4A to 5B of 4th to 6th Periods of the Periodic Table.

(24) The method for producing a thermal expansion inhibitor of (23), which comprising controlling the operating temperature of the inhibitor by changing a part of the crystal having a composition of the formula (10) with at least one kind of atom selected from Fe, Ta, Cr, and Nb.

ADVANTAGE OF THE INVENTION

First, the invention has made it possible to broaden the magnetic transition temperature range of a manganese nitride, or that is, the temperature range thereof in which negative thermal expansion is exhibited, for example, to at least 100° C., and has made it possible to ensure the linear temperature profile of the negative thermal expansion of the compound, for example, over an at least about 70° C. range. Accordingly, the invention has provided industrial applicability of manganese nitride as a thermal expansion inhibitor.

Secondly, the thermal expansion inhibitor of the invention is applicable to a broader temperature range than any known conventional thermal expansion inhibitors. In addition, the inhibitor can keep its negative thermal expansion even in a high temperature range. Accordingly, for example, even to a material that may be heated at 200° C. or higher, the inhibitor of the invention can be used for thermal expansion inhibition of the material. As a result, even in members that are used in high-temperature environments and in devices of plural articles jointed together, a suitable thermal expansion inhibitor of the invention may be selected and used, and the invention has made it possible to control the thermal expansion of such complicated members or devices.

Thirdly, the thermal expansion inhibitor of the invention exhibits isotropic volume expansion, and is therefore readily applicable to materials without influence by the degree of sintering of the materials such as $SiO_2$.

Fourthly, the performance of the thermal expansion inhibitor of the invention is accurately controllable according to the thermal expansion of the objects and to the increase of temperature of the objects. Accordingly, the invention has made it possible to provide materials having a zero thermal expansion within a specific temperature range and materials having a larger negative thermal expansion than conventional materials (for example, having a coefficient of linear thermal expansion of at least −30μ/° C.). As a result, the invention has made it possible to control thermal expansion of materials having a large thermal expansion such as resins and organic substances. In addition, the thermal expansion inhibitor of the invention may be favorably used in precision articles.

Fifthly, the thermal expansion inhibitor of the invention can be used as powder, and can be sintered in any desired shape like ceramics. In addition, it may be readily mixed with materials.

Sixthly, the thermal expansion inhibitor of the invention is a nitride, and it can therefore increase the mechanical strength of article to which it is applied, or can keep the strength thereof as such.

Seventhly, the thermal expansion inhibitor of the invention is metallic, and is therefore characterized by metallic properties such as high electric conductivity and high thermal conductivity.

Eighthly, the thermal expansion inhibitor of the invention can be composed only of economical and ecological substance, and it is therefore favorable in terms of costs and environment.

BEST MODE FOR CARRYING OUT THE INVENTION

Figure 1:
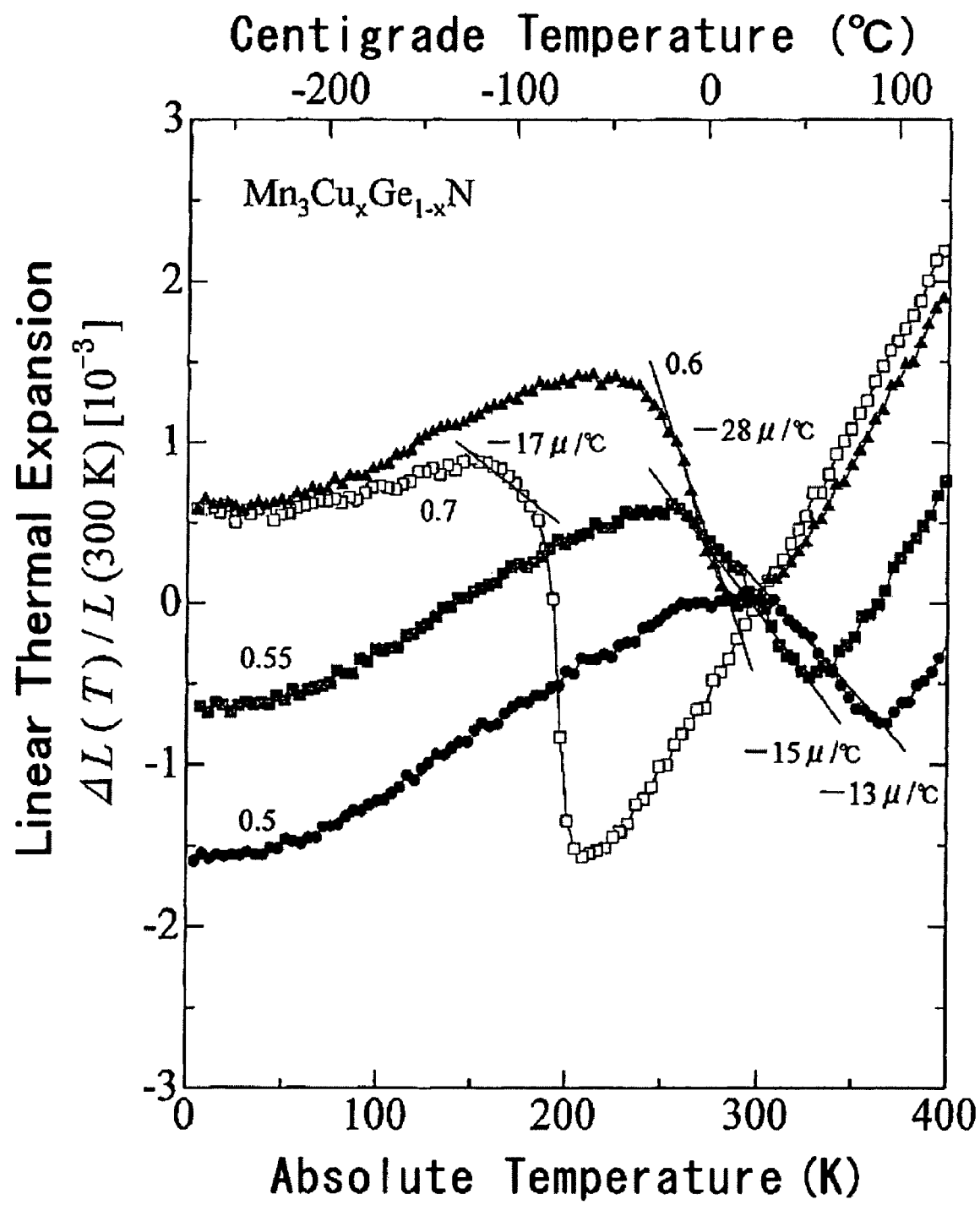
FIG. 1 is a graph showing the effect of a thermal expansion inhibitor of the invention.

The contents of the invention are described in detail hereinafter. In this description, the numerical range expressed by the wording "a number to another number" means the range that falls between the former number indicating the lowermost limit of the range and the latter number indicating the uppermost limit thereof.

Unless otherwise specifically indicated, the manganese nitride in the invention is described herein as those with neither atomic defects nor atomic excesses that may occur in ordinary crystal lattices (especially perovskite manganese nitrides). But not overstepping the gist and the scope of the invention, any others with defects and/or excesses that may generally occur in the crystal lattices of the type are to be within the scope of the invention.

The manganese nitride contained in the thermal expansion inhibitor of the invention has negative thermal expansion over an at least 10° C. range, and for example, comprises a composition of the following formula (1):

$$Mn_{4-x}A_xB \quad \text{Formula (1)}$$

wherein A is one kind of atom selected from Co, Ni, Cu, Zn, Ga, Rh, Pd, Ag, Cd, and In, and 0<x<4 but x is not an integer; or A consists of at least two kinds of atoms selected from Al, Si, Sc, and atoms of Groups 4A to 5B of 4th to 6th Periods of the Periodic Table, and at least one kind of the atoms is any of Co, Ni, Cu, Zn, Ga, Rh, Pd, Ag, Cd, and In, and 0<x<4; and B is a nitrogen atom, wherein some of B in the crystal may be substituted with a carbon atom or the like.

When the atom A consists of any of Al, Si, Sc and atoms of Groups 4A to 5B of 4th to 6th Periods of the Periodic Table, then A is preferably any of Co, Ni, Cu, Zn, Ga, Rh, Pd, Ag, Cd and In, more preferably any of Ni, Cu, Zn, Ga, Ag and In, even more preferably Ga.

On the other hand, when the atom A consists of at least two kinds of atoms selected from of Al, Si, Sc and atoms of Groups 4A to 5B of 4th to 6th Periods of the Periodic Table, then it is desirable that at least one kind of them is any of Co, Ni, Cu, Zn, Ga, Rh, Pd, Ag, Cd and In, and at least one other kind of them is any of Co, Ni, Cu, Zn, Ga, Rh, Pd, Ag, Cd, In, Cr, Fe, Ge, Nb, Sn, Ta, Pt and Zr; more preferably the atom A consists of at least one kind of Ni, Cu, Zn, Ga, Ag and In and at least one kind of Ge, Sn, Fe, Ta, Cr and Nb.

Of course, A may consists of at least three kinds of atoms. When A consists of at least three kinds of atoms, then it is desirable that at least one kind of them is any of Fe, Ta and Nb. Preferred examples of the combination are Fe, Zn, Ge; Fe, Cu, Ge; Fe, Ga, Ge; Fe, In, Ge; Ta, Cu, Ge; Nb, Zn, Sn.

Regarding x, when A is one kind of atom, then 0<x<4 but x is not an integer, preferably 0<x<2 but x is not an integer, more preferably 0.6<x<1.3 but x is not an integer, even more preferably 0.8<x<1.1 but x is not an integer. On the other hand, when A consists of at least two kinds of atoms, then 0<x<4, preferably 0<x<2, more preferably 0.6<x<1.4, even more preferably 0.83<x<1.15.

B is a nitrogen atom, wherein some of B in the crystal may be substituted with a carbon atom or the like, preferably a nitrogen atom, in which some of B be substituted with a carbon atom (the same shall apply to the other formulae mentioned hereinafter).

The formula (1) is preferably any of the following formulae (2) to (4):

$$Mn_{3+x2}A^{21}_{y2}A^{22}_{1-x2-y2}B \qquad \text{Formula (2)}$$

wherein $A^{21}$ is one kind of atom selected from Co, Ni, Cu, Zn, Ga, Rh, Pd, Ag, Cd, and In, $A^{22}$ is one or more kinds of atoms selected from Al, Si, Sc, and atoms of Groups 4A to 5B of 4th to 6th Periods of the Periodic Table, in which $A^{21}$ and $A^{22}$ are not the same and are not Mn; $0 \leq x2 < 1$, $0 < y2 < 1$, and $1 > x2+y2$; and B is a nitrogen atom, wherein some of B in the crystal may be substituted with a carbon atom or the like.

$A^{21}$ is preferably any of Ni, Cu, Zn, Ga, Ag, and In, more preferably any of Cu, Zn, Ga, and In. $A^{22}$ is preferably any of Co, Ni, Cu, Zn, Ga, Rh, Pd, Ag, Cd, In, Ge, and Sn, more preferably any of Cu, Zn, Ga, In, Ge, and Sn. x2 is preferably $0 \leq x2 < 0.2$, more preferably $0 \leq x2 < 0.1$, even more preferably $x=0$. On the other hand, y2 is preferably $0.35 < y2 < 0.8$, more preferably $0.4 < y2 < 0.7$, even more preferably $0.4 < y2 < 0.65$.

Concrete examples of the formula (2) are the following formulae (2-2) to (2-4):

$$Mn_{3+x2}A^{21}_{y2}A^{22}_{1-x2-y2}B \qquad \text{Formula (2-2)}$$

wherein $A^{21}$ is one kind of atom selected from Co, Ni, Cu, Zn, Ga, Rh, Pd, Ag, Cd, and In, and $A^{22}$ is one kind of atom selected from Co, Ni, Cu, Zn, Ga, Rh, Pd, Ag, Cd, In, Ge, and Sn, in which $A^{21}$ and $A^{22}$ are not the same; $0 \leq x2 < 1$, $0.35 < y2 < 0.8$, and $1 > x2+y2$; and B is a nitrogen atom, wherein some of B in the crystal may be substituted with a carbon atom or the like.

x2 is preferably $0 \leq x2 < 0.17$, more preferably $0 \leq x2 < 0.1$, even more preferably $x2=0$. On the other hand, y2 is preferably $0.4 < y2 < 0.7$, more preferably $0.4 < y2 < 0.65$.

$$Mn_{3+x2}A^{21}_{y2}A^{22}_{1-x2-y2}B \qquad \text{Formula (2-3)}$$

wherein $A^{21}$ is one kind of atom selected from Ni, Cu, Zn, Ga, Ag, and In; $A^{22}$ is Ge or Sn; x2 is 0; $0.35 < y2 < 0.8$; and B is a nitrogen atom, wherein some of B in the crystal may be substituted with a carbon atom or the like.

In the formula (2-3), preferably $0.4 < y2 < 0.75$, more preferably $0.4 < y2 < 0.65$.

$$Mn_{3+x2}A^{21}_{y2}A^{22}_{1-x2-y2}B \qquad \text{Formula (2-4)}$$

wherein $A^{21}$ is one kind of atom selected from Ni, Cu, Zn, Ga, Ag, and In; $A^{22}$ is Ge or Sn; $0 < x2 < 0.2$; $0.35 < y2 < 0.7$; and B is a nitrogen atom, wherein some of B in the crystal may be substituted with a carbon atom or the like.

In the formula (2-4), x2 is preferably $0 < x2 < 0.17$, more preferably $0 < x2 < 0.15$, even more preferably $0 < x2 < 0.13$. On the other hand, y2 is preferably $0.4 < y2 < 0.65$, more preferably $0.4 < y2 < 0.63$.

$$Mn_{3-x3}A^{31}_{y3}A^{32}_{1+x3-y3}B \qquad \text{Formula (3)}$$

wherein $A^{31}$ is one kind of atom selected from Co, Ni, Cu, Zn, Ga, Rh, Pd, Ag, Cd, and In, $A^{32}$ consists of one or more kinds of atoms selected from Al, Si, Sc, and atoms of Groups 4A to 5B of 4th to 6th Periods of the Periodic Table, in which $A^{31}$ and $A^{32}$ are not the same and are not Mn; $0 < x3 < 1$, $0 < y3 < 2$, and $1 + x3 - y3 > 0$; and B is a nitrogen atom, wherein some of B in the crystal may be substituted with a carbon atom or the like.

Herein, $A^{31}$ is preferably any of Ni, Cu, Zn, Ga, Ag, and In, more preferably any of Cu, Zn, Ga, and In. $A^{32}$ is preferably any of Co, Ni, Cu, Zn, Ga, Rh, Pd, Ag, Cd, In, Ge, and Sn, more preferably any of Cu, Zn, Ga, In, Ge, and Sn. x3 is preferably $0 < x3 < 0.2$, more preferably $0 < x3 < 0.15$, even more preferably $0 < x3 < 0.1$. On the other hand, y3 is preferably $0.35 < y3 < 0.8$, more preferably $0.4 < y3 < 0.7$, even more preferably $0.4 < y3 < 0.6$.

$$Mn_{3-x4}A^{41}_{y4}A^{42}_{1-y4}A^{43}_{x4}B \qquad \text{Formula (4)}$$

wherein $A^{41}$ is one kind of atom selected from Co, Ni, Cu, Zn, Ga, Rh, Pd, Ag, Cd, and In, $A^{42}$ is one kind of atom selected from Co, Ni, Cu, Zn, Ga, Rh, Pd, Ag, Cd, In, Ge, and Sn, in which $A^{41}$ and $A^{42}$ are not the same; $A^{43}$ is one kind of atom selected from Fe, Ta, Cr, and Nb; $0 < x4 < 0.3$, and $0.35 < y4 < 0.8$; and B is a nitrogen atom, wherein some of B in the crystal may be substituted with a carbon atom or the like.

Herein, x4 is preferably $0 < x4 < 0.2$, more preferably $0 < x4 < 0.15$, even more preferably $0 < x4 < 0.1$. On the other hand, y4 is preferably $0.35 < y4 < 0.7$, more preferably $0.4 < y4 < 0.6$.

One concrete example of the formula (4) is shown by the following formula (4-2):

$$Mn_{3-x4}A^{41}_{y4}A^{42}_{1-y4}A^{43}_{x4}B \qquad \text{Formula (4-2)}$$

wherein $A^{41}$ is one kind of atom selected from Ni, Cu, Zn, Ga, Ag, and In; $A^{42}$ is Ge or Sn; $A^{43}$ is one kind of atom selected from Fe or Ta; $0 < x4 < 0.3$, and $0.35 < y4 < 0.8$; and B is a nitrogen atom, wherein some of B in the crystal may be substituted with a carbon atom or the like.

Herein, x4 is preferably $0 < x4 < 0.2$, more preferably $0 < x4 < 0.15$. On the other hand, y4 is preferably $0.35 < y4 < 0.7$, more preferably $0.4 < y4 < 0.6$.

$$Mn_{4-x5}A^{51}_{x5}B \qquad \text{Formula (5)}$$

wherein $A^{51}$ is one kind of atom selected from Ni, Cu, Zn, Ga, Ag, and In; $0.6 < x5 < 1.3$ but x5 is not 1; and B is a nitrogen atom, wherein some of B in the crystal may be substituted with a carbon atom or the like.

In the formula (5), x5 is preferably $0.8 < x5 < 1.1$ but x5 is not 1.

The manganese nitride for use in the invention may be a perovskite manganese nitride prepared by sintering at least two kinds of compounds shown by the following formula (10):

$$Mn_3A^1N \qquad \text{Formula (10)}$$

wherein $A^1$ is one kind of atom selected from Al, Si, Sc, and atoms of Groups 4A to 5B of 4th to 6th Periods of the Periodic Table.

Also employable herein is a perovskite manganese nitride prepared by sintering at least $Mn_2N$ and two or more kinds selected from the group consisting of Al, Si, Sc, atoms of Groups 4A to 5B of 4th to 6th Periods of the Periodic Table and their nitrides.

The manganese nitride used in the invention may be, for example, a manganese nitride containing at least an atom more effective for lattice thermal contraction than Ni and at least an atom more effective for broadening the volume change caused by magnetic phase transition than Sn. More preferably, the manganese nitride additionally contains at least one of Fe, Ta, Cr, and Nb.

The atom that is more effective for lattice thermal contraction than Ni as referred to herein may be grasped from, for example, the descriptions in Non-Patent References 1 to 8. On the other hand, the atom that is more effective for broadening the volume change than Sn is a concept that the present inventors have clarified, and as shown in Examples given hereinafter, this means that the atom is, in a compound containing it, more effective for broadening the volume change of the compound than Sn. Concretely, its preferred examples are Co, Ni, Cu, Zn, Ga, Rh, Pd, Ag, Cd, In, and Ge.

Fe, Ta, Cr and Nb are effective for controlling the operating temperature of the compound containing it.

The manganese nitride in the thermal expansion inhibitor of the invention preferably has a perovskite crystal structure. The manganese nitride in the thermal expansion inhibitor of the invention may be any of a cubic system compound or a slightly-deformed cubic system compound (e.g., a hexagonal system, a monoclinic system, an orthorhombic system, a tetragonal system, a trigonal system, etc), and is preferably a cubic compound.

In the thermal expansion inhibitor of the invention, some of the nitrogen atom may be substituted with a carbon atom or the like. The degree of substitution is preferably at most 20%, more preferably at most 15%, even more preferably at most 10%. Not specifically defined, preferred examples of the substitutive atom except carbon are B, S, O, and P; and more preferred are S, O, and P.

Preferably, the nitrogen atom exists at the center of the crystal lattice of the manganese nitride. The nitrogen atom or the like herein exists at the center of the crystal when a manganese nitride has neither atomic defects nor atomic excesses. For example, in a slightly-deformed cubic system compound, the position of the atom corresponds to the octahedral center of the cubic system. Accordingly, this means that, not overstepping the gist of the invention, for example, $Mn_3Cu_{0.5}Ge_{0.5}N$ in which Mn/N (containing partly-substituted C or the like) is 3/1.05 or 3/0.95 is within the scope of the invention.

The thermal expansion inhibitor of the invention has negative thermal expansion over an at least 10° C. range, preferably over an at least 15° C. range, more preferably over an at least 20° C. range, even more preferably over an at least 30° C. range, most preferably over an at least 40° C. range. The coefficient of linear thermal expansion of the thermal expansion inhibitor is less than 0/° C., preferably from $-1\times10^{-6}$/° C. to $-100\times10^{-6}$/° C., more preferably from $-5\times10^{-6}$/° C. to $-100\times10^{-6}$/° C., even more preferably from $-10\times10^{-6}$/° C. to $-100\times10^{-6}$/° C. The temperature range within which the thermal expansion inhibitor has such negative thermal expansion is preferably at least one or more of (1) between −20° C. and 100° C., (2) 100° C. or higher (preferably from 100° C. to 250° C.), (3) −20° C. or lower (preferably between −100° C. and −20° C.), (4) between −200° C. and −100° C.

Preferred examples of the manganese nitride to be in the thermal expansion inhibitor of the invention are mentioned below. Of course, the thermal expansion inhibitor of the invention should not be limited to these. In addition, manganese nitrides that are prepared by substituting some of the nitrogen atom in the manganese nitrides mentioned below with a carbon atom or the like are also preferred examples for use in the invention.

$Mn_3Cu_{0.3-0.5}Ge_{0.5-0.7}N$, $Mn_3Cu_{0.35-0.55}Ge_{0.45-0.65}N$ (more preferably, $Mn_3Cu_{0.50-0.55}Ge_{0.45-0.50}N$), $Mn_3Cu_{0.4-0.6}Ge_{0.4-0.6}N$, $Mn_3Cu_{0.43-0.63}Ge_{0.37-0.57}N$, $Mn_3Cu_{0.45-0.65}Ge_{0.35-0.55}N$, $Mn_3Cu_{0.5-0.7}Ge_{0.3-0.5}N$, $Mn_3Cu_{0.6-0.8}Ge_{0.2-0.4}N$, $Mn_3Zn_{0.4-0.6}Ge_{0.4-0.6}N$, $Mn_3Zn_{0.5-0.7}Ge_{0.3-0.5}N$, $Mn_3Ag_{0.65-0.85}Ge_{0.15-0.35}N$, $Mn_3In_{0.65-0.85}Ge_{0.15-0.35}N$, $Mn_3Ga_{0.55-0.75}Ge_{0.25-0.45}N$, $Mn_3Ga_{0.5-0.7}Sn_{0.3-0.5}N$, $Mn_3Ga_{0.7-0.9}Sn_{0.1-0.3}N$, $Mn_3Cu_{0.4-0.6}Sn_{0.4-0.6}N$, $Mn_{2.87-2.89}Fe_{0.11-0.13}Zn_{0.3-0.5}Ge_{0.5-0.7}N$, $Mn_{2.93-2.95}Fe_{0.05-0.07}Zn_{0.4-0.6}Ge_{0.4-0.6}N$, $Mn_{2.87-2.89}Fe_{0.11-0.13}Zn_{0.4-0.6}Ge_{0.4-0.6}N$, $Mn_{2.87-2.89}Fe_{0.11-0.13}Zn_{0.45-0.65}Ge_{0.35-0.55}N$, $Mn_{2.90-2.92}Cr_{0.08-0.10}GaN$, $Mn_{2.75-2.95}Nb_{0.05-0.25}Zn_{0.4-0.6}Sn_{0.4-0.6}N$, $Mn_{2.93-2.95}Fe_{0.05-0.07}Cu_{0.3-0.5}Ge_{0.5-0.7}N$, $Mn_{2.80-2.90}Ta_{0.10-0.20}Cu_{0.5-0.7}Ge_{0.3-0.5}N$, $Mn_{3.0-3.2}Zn_{0.3-0.5}Ge_{0.4-0.5}N$, $Mn_{3.05-3.15}Zn_{0.3-0.5}Ge_{0.35-0.55}N$, $Mn_{3.0-3.2}Ga_{0.4-0.6}Ge_{0.3-0.5}N$, $Mn_{3.0-3.2}Ga_{0.5-0.7}Ge_{0.4-0.6}N$, $Mn_{3.03-3.23}Ga_{0.57-0.77}Ge_{0.1-0.3}N$, $Mn_{3.05-3.25}Ga_{0.45-0.65}Ge_{0.2-0.4}N$, $Mn_{3.07-3.27}Ga_{0.53-0.73}Ge_{0.1-0.3}N$, $Mn_{3.1-3.3}Ga_{0.5-0.7}Ge_{0.1-0.3}N$, $Mn_3Ga_{0.7-0.9}Ge_{0.1-0.3}N_{0.94-0.96}C_{0.04-0.06}$, $Mn_3Ga_{0.6-0.8}Ge_{0.2-0.4}N_{0.92-0.94}C_{0.06-0.08}$, $Mn_3Ga_{0.60-0.70}Ge_{0.30-0.40}N_{0.92-0.94}C_{0.06-0.08}$, $Mn_3Ga_{0.6-0.8}Ge_{0.2-0.4}N_{0.89-0.91}C_{0.09-0.11}$, $Mn_3Cu_{0.4-0.6}Ga_{0.4-0.6}N$, $Mn_3Cu_{0.4-0.6}Ni_{0.4-0.6}N$, $Mn_3In_{0.65-0.85}Co_{0.15-0.35}N$, $Mn_{3.10-3.20}Ge_{0.80-0.90}N$, $Mn_3Cu_{0.70-0.90}Pd_{0.10-0.30}N$.

The thermal expansion inhibitor of the invention may be utilized as a temperature-compensatory material that cancels thermal expansion of an ordinary material, and it may be used in producing a negative thermal expansion material that expands negatively within a specific temperature range. Further, it may be used in producing a zero thermal expansion material that does not expand positively or negatively within a specific temperature range. In addition, the thermal expansion inhibitor of the invention can be used for inhibition or control of thermal expansion. For example, when it is added to a material that greatly expands on heating, then it may control (reduce) the thermal expansion of the material to a degree falling within an acceptable range for the material. When mixed with any other material, it may produce a material having an intended degree of thermal expansion.

When the thermal expansion inhibitor of the invention is used as a negative thermal expansion material or a zero thermal expansion material, the type of the material is not specifically defined, not overstepping the gist and the scope of the invention. For example, the thermal expansion inhibitor of the invention is widely applicable to known materials such as glass, resins, ceramics, metals, alloys, etc. In particular, the thermal expansion inhibitor of the invention can be used as powder, it is favorably used in ceramics and others that can be sintered in any desired shape.

The thermal expansion inhibitor of the invention may be produced in any known method. For example, it may be produced by heating and sintering the material in nitrogen gas under a pressure of from 0.5 to 10 atm at a temperature of from 500 to 1000° C. for 10 to 100 hours. In particular, when the material is processed with high-pressure nitrogen (for example, at 7 to 10 atm), then the temperature at which the resulting compound begins to show negative thermal expansion may be lowered and the coefficient of linear thermal expansion of the compound may be reduced (that is, the negative thermal expansion of the compound may be enlarged).

The thermal expansion inhibitor of the invention may be subjected to oxygen annealing treatment. For oxygen annealing treatment, for example, the inhibitor may be processed with oxygen under a pressure of from 0.5 to 3 atm at 300 to 500° C. for 10 to 100 hours. After thus processed for oxygen annealing treatment, the lowermost temperature at which the resulting compound begins to have a negative coefficient of linear thermal expansion may be elevated and the coefficient of linear thermal expansion of the compound may be enlarged (that is, the negative thermal expansion of the compound may be reduced).

Magnetovolume effect is a phenomenon that the volume of a magnetic metallic material increases in correspondence with the extension of the magnetic moment thereof. The volume change at the magnetic transition point of the manganese nitride of the formula (1) is understood as a typical example of magnetovolume effect. Accordingly, the volume expansion of the manganese nitride has the same meaning as the extension of the magnetic moment thereof, and the volume change of the compound indicates the amplitude of the magnetic moment thereof (when the compound is a ferromagnetic substance, it is the degree of magnetization thereof).

When the volume of the compound increases discontinuously at the magnetic transition point thereof, that is, when the magnetic moment thereof extends discontinuously, then the entropy change of the compound in the magnetization process becomes large around the transition point of the compound, and therefore the compound may be favorably used as a working substance in a magnetic refrigerating device (the cooling power in magnetic refrigeration is proportional to the entropy change). Accordingly, the ferromagnetic manganese nitride having a composition of the formula (1) can be favorably used as a magnetic material for magnetic refrigeration. The magnetic material for magnetic refrigeration herein is, for example, a material that is used for magnetic refrigeration within a high-temperature range, and this is used as a coolant medium in cooling with a magnetic refrigerating device not using freon gas or the like. More concretely, it may be used as a magnetic refrigerating material in the magnetic refrigerating device described in paragraphs [0017] to [0018] in JP-A 11-238615, or as a magnetic working substance in the magnetic refrigerating device described in JP-A 2002-106999.

In particular, when the manganese nitride having a composition of the formula (1) and containing an atom more effective for gradual volume change than Sn (Co, Ni, Cu, Zn, Ga, Rh, Pd, Ag, Cd, In, Ge, and the like) is used as a magnetic material for magnetic refrigeration, then the shock resulting from rapid volume change of the compound may be reduced and a large magnetic moment extension can be continuously kept within a certain temperature range, and therefore the operating temperature range in which one composition works as a magnetic coolant can be broadened.

Further, the manganese nitride having a composition of the formula (1) and containing Fe, Ta, Cr or Nb is favorably used as a magnetic material for magnetic refrigeration because the operating temperature is tunable with ease.

Still further, the manganese nitride having a composition of the formula (1) can be used along with any other magnetic material for magnetic refrigeration, or can be used as an auxiliary agent for other magnetic refrigerating materials.

In addition, the manganese nitride having a composition of the formula (1) can also be used favorably for cooling storage media.

EXAMPLES

The invention is described more concretely with reference to the following Examples. In the following Examples, the materials used, amount and ratio thereof, the details of the treatment and the treatment process may be suitably modified or changed not overstepping the gist and the scope of the invention. Accordingly, the invention should not be limited to the Examples mentioned below.

(1) Production of Thermal Expansion Inhibitor:

$Mn_3A^1N$ and $Mn_3A^2N$ (where $A^1$ and $A^2$ are any of Mn, Co, Ni, Cu, Zn, Ga, Ge, Pd, Ag, In or Sn; the same shall apply hereinafter) were prepared by mixing and stirring $Mn_2N$ and A in a ratio by mol of $Mn_2N$ to A, $Mn/A^1$ or $A^2=3/1$, then by putting and sealing up the resulting mixture in vacuum (about $10^{-3}$ torr) in a quartz tube, and by heating and sintering it therein at 500 to 770° C. for 60 to 70 hours. However, $Mn_3GaN$ was prepared, starting from $Mn_2N$ and GaN, by heating and sintering them in nitrogen gas of 1 atm at 760° C. for 60 hours. $Mn_4N$ was prepared, starting from a metal Mn, by heating and sintering in nitrogen gas of 1 atm at 450° C. for 120 hours.

$Mn_3A^1_{1-x1}A^2_{x1}N$ was produced as follows: A powder of $Mn_3A^1N$ and a powder of $Mn_3A^2N$ prepared in the manner as above were mixed and stirred in the intended molar ratio $(1-x1)/(x1)$, then pressed into a pellet, and finally heated and sintered at 800° C. for 60 hours in a quartz tube sealed under vacuum or in nitrogen gas of 1 atm.

$Mn_3GaC$ was produced as follows: Mn, Ga, and C (carbon atom) were mixed and stirred in a molar ratio of 3/1/1.05 in that order, then put and sealed up in vacuum (about $10^{-3}$ torr) in a quartz tube, and heated and sintered therein at 550 to 850° C. for 80 to 120 hours. Herein, the proportion of C is 1.05 for the purpose of compensating the carbon deficiency during sintering. The obtained $Mn_3GaC$ was mixed with other materials to have a composition mentioned below, for example, for $Mn_3Ga_{1-x}A^2_xN_{1-y}C_y$, powders of $Mn_3GaN$, $Mn_3A^2N$ and $Mn_3GaC$ were mixed and stirred in a molar ratio of $(1-x-y)/x/y$, then pressed into a pellet, put and sealed up in vacuum in a quartz tube, and heated and sintered at 800° C. for 60 to 80 hours to obtain a carbon-substituted compound.

$Mn_{3-x2}A^3_{x2}A^1_{1-x3}A^2_{x3}N$ was produced as follows: as the starting materials, $Mn_2N$, a single substance $A^3$ (Fe, Ta, Cr or Nb) or a compound $A^3_4N$, and single substances $A^1$ and $A^2$ were mixed and stirred in a molar ratio of $Mn/A^3/A^1/A^2=(3-x2)/x2/(1-x3)/x3$, then put and sealed up in vacuum in a quartz tube, and heated at 650 to 770° C. for 60 to 70 hours to prepare a powdery sample. The obtained powder was pressed into a pellet and heated and sintered at 800° C. for 60 hours in a quartz tube sealed under vacuum or in nitrogen gas of 1 atm.

In producing the samples as above, the starting materials used were all in the form of powder having a purity of at least 99.9%. Stirring the starting powders and other materials was attained all the time in nitrogen gas. The nitrogen gas to be used was filtered (through Nikka Seiko's DC-A4 and GC-RX) to remove humidity and oxygen. The produced samples were analyzed through powdery X-ray diffractiometry (by Debye-Scherer's method), which confirmed that they are a single-phase cubic crystal at room temperature.

(1-1) High-Pressure Nitrogen Treatment:

Some of the samples that were heated and sintered in nitrogen gas of 1 atm at 800° C. for 60 hours in the above (1), were then further heated in nitrogen gas of 8 atm at 800° C. for 60 hours.

(2) Measurement of Thermal Expansion:

A strain gauge (Kyowa Dengyo's KFL-02-120-C1-11) was used for measuring the coefficient of linear thermal expansion of the samples. Using an adhesive (Kyowa Dengyo's PC-6), a strain gauge was attached on a sintered sample with a rectangular shape of 4×4×1 mm$^3$. A load was applied thereto by clipping it with a double clip for documents (Kokuyo J-35), and this was kept in nitrogen gas of 1 atm at 80° C. for 1 hour, then at 130° C. for 2 hours and then at 150° C. for 2 hours. After the clip was removed, the sample was kept in nitrogen gas of 1 atm at 150° C. for 2 hours. The resistance value R of the strain gauge was measured using a Physical Property Measurement System (Quantum Design's PPMS6000). As a reference sample, used was an oxygen-free copper plate (having a purity of 99.99%). A strain gauge was attached on the copper plate in the same manner as above, and the resistance strain value ΔR/R of the strain gauge was firstly measured. Next, from the coefficient of linear thermal expansion of Cu in the literatures [G. K. White and J. G. Collins, J. Low Temp. Phys. 7, 43 (1972); G. K. White, J. Phys. D: Appl. Phys. 6, 2070 (1973)], the correction value was calculated that should be subtracted from the resistance strain value of the strain gauge attached on the sample. Using it, the linear thermal expansion ΔL/L of the sample was obtained. In case of isotropic substances, the value obtained by dividing the volume thermal expansion ΔV/V by 3 corresponds to the linear thermal expansion. The samples in this Example are all isotropic substances.

(3) The Results are Shown in the Drawings Attached Hereto.

Figure 2:
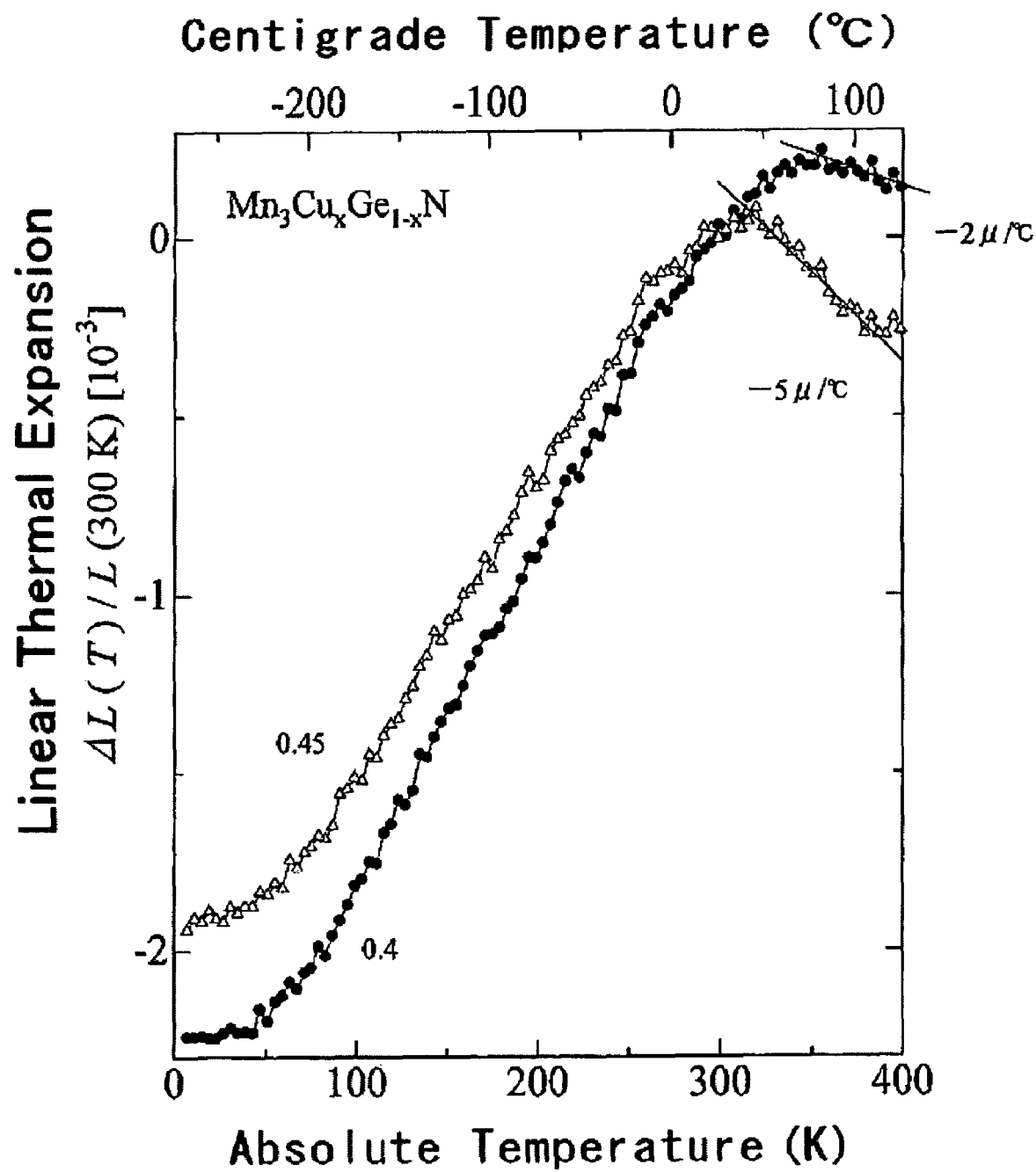
FIG. 2 is a graph showing the effect of another thermal expansion inhibitor of the invention.
Figure 3:
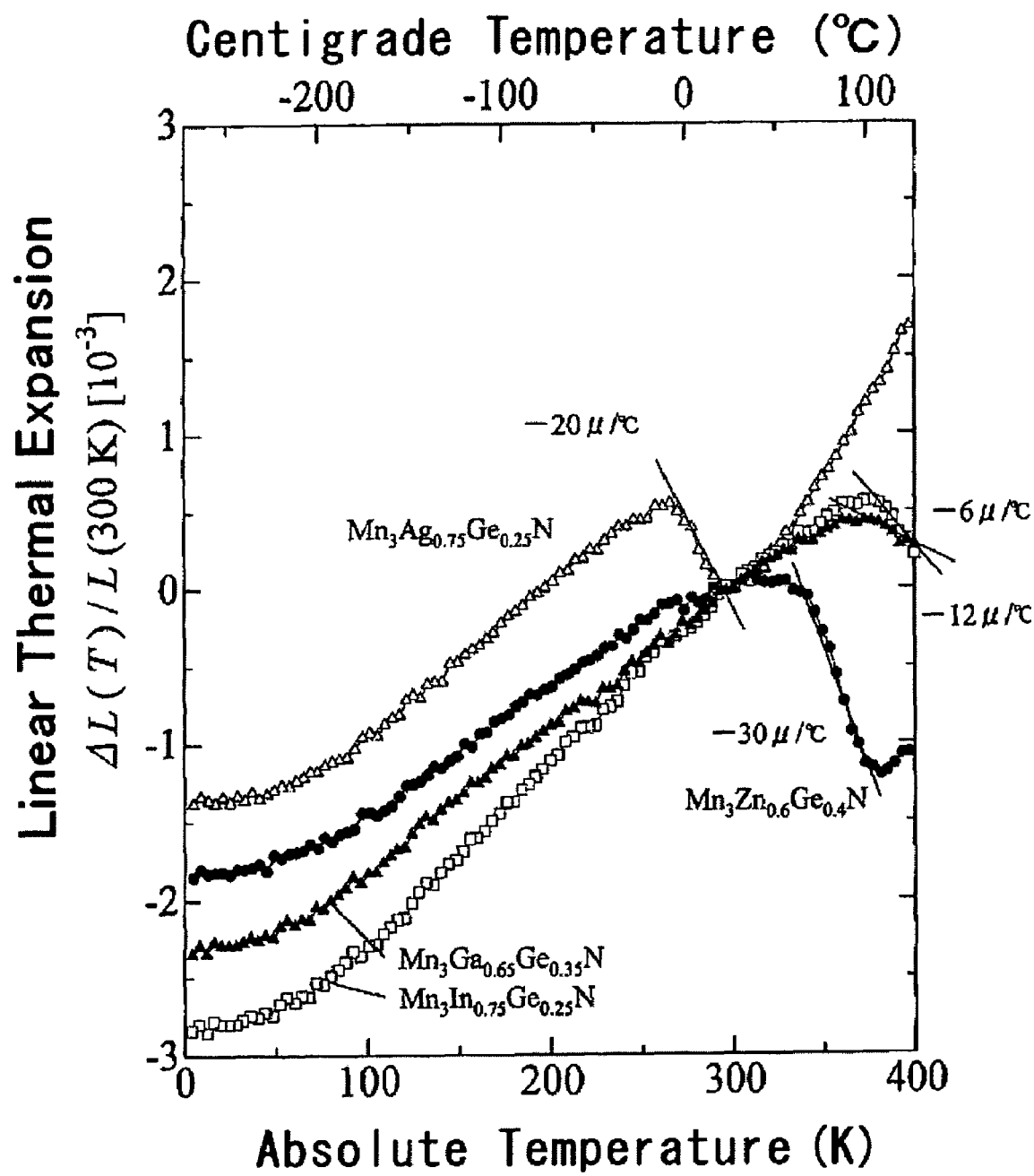
FIG. 3 is a graph showing the effect of another thermal expansion inhibitor of the invention.
Figure 4:
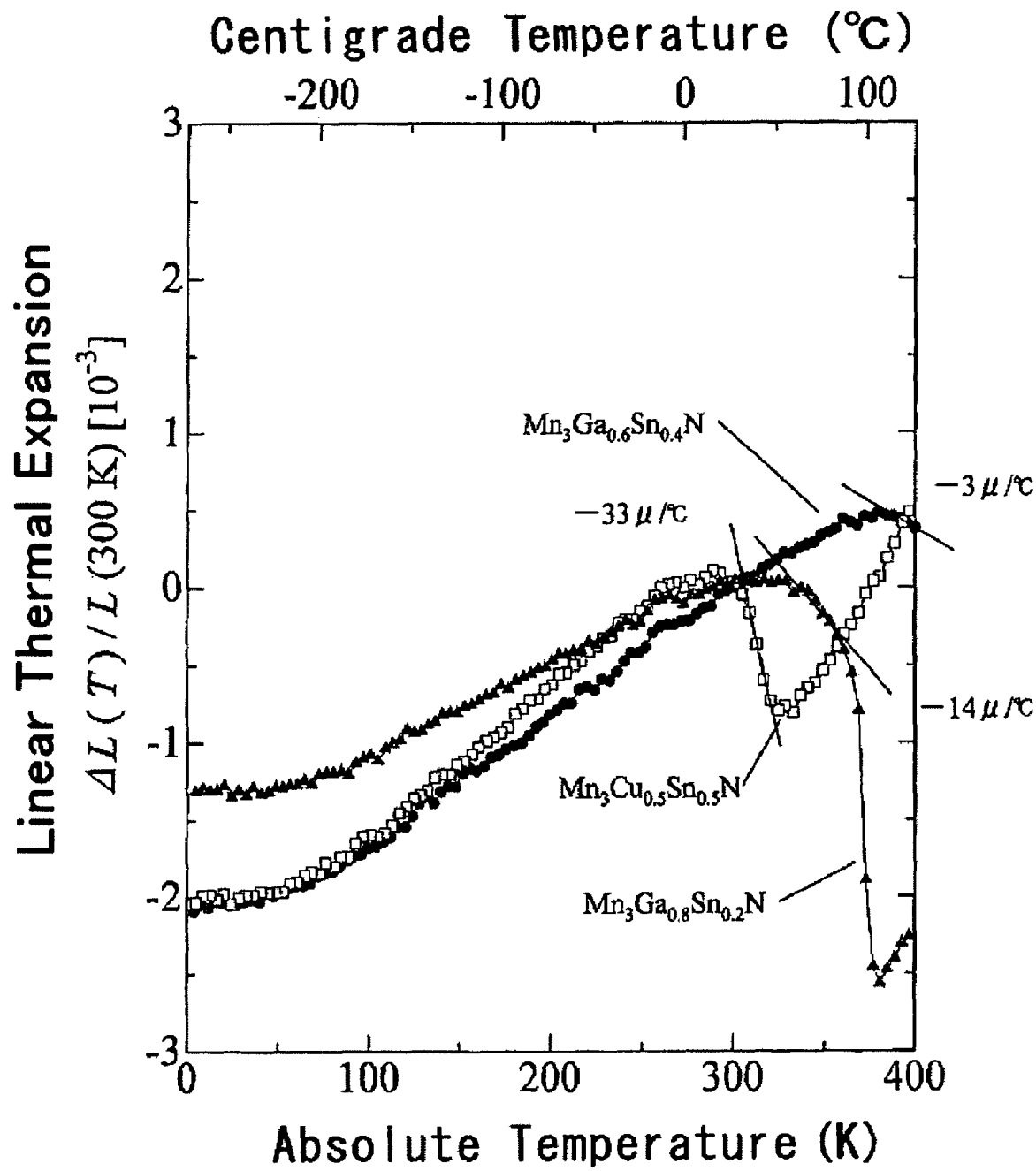
FIG. 4 is a graph showing the effect of another thermal expansion inhibitor of the invention.
Figure 5:
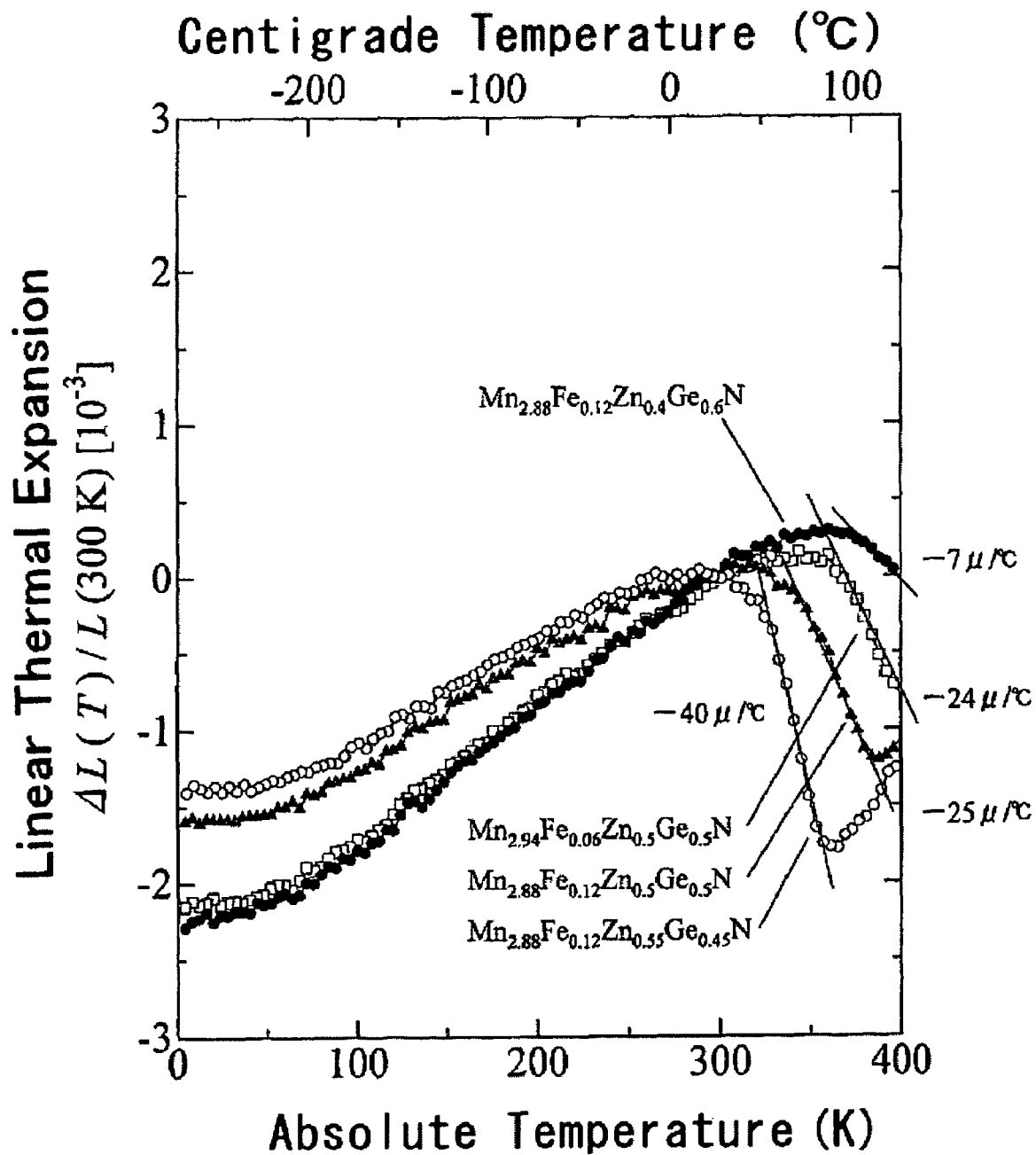
FIG. 5 is a graph showing the effect of another thermal expansion inhibitor of the invention.
Figure 6:
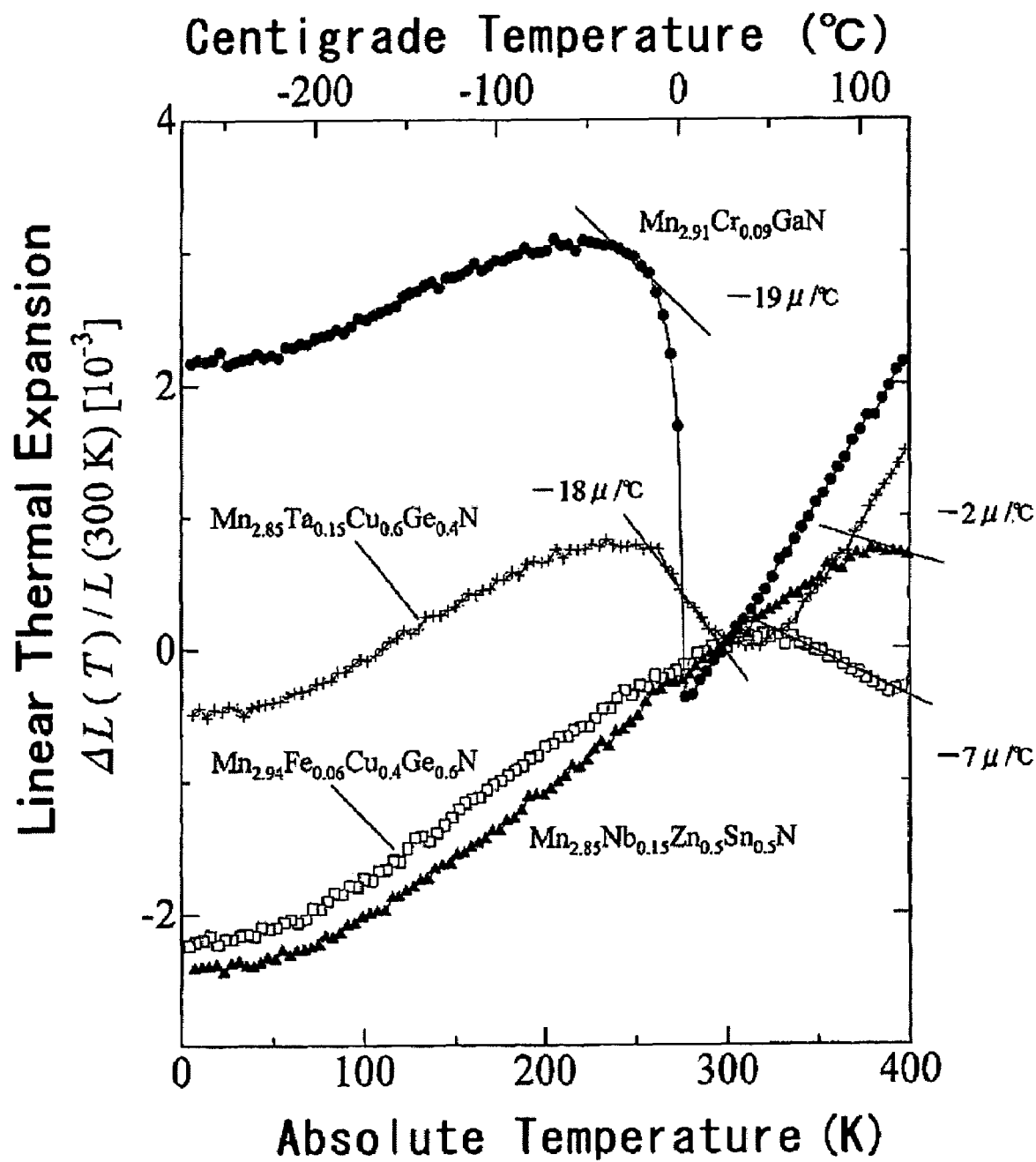
FIG. 6 is a graph showing the effect of another thermal expansion inhibitor of the invention.
Figure 7:
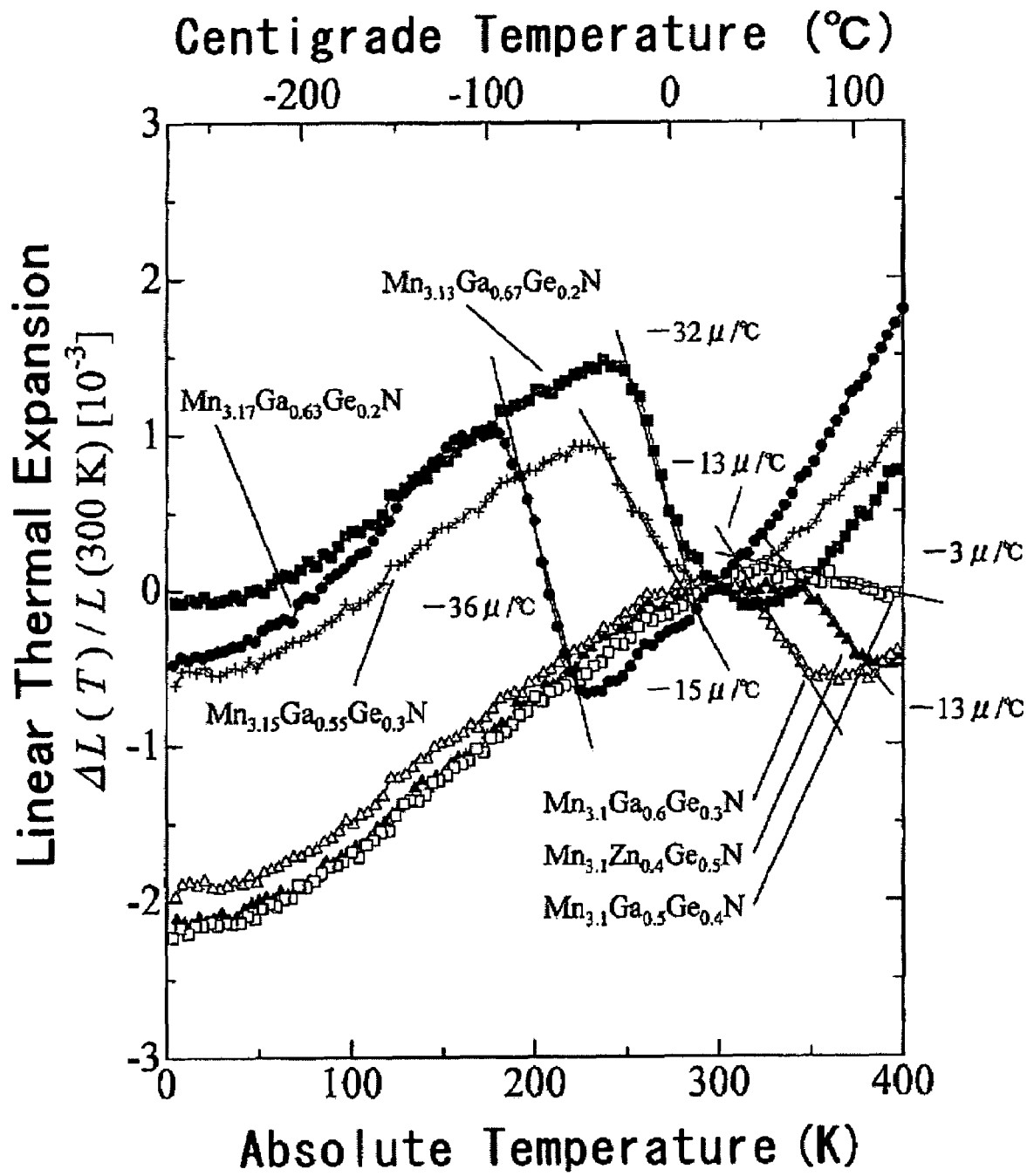
FIG. 7 is a graph showing the effect of another thermal expansion inhibitor of the invention.
Figure 8:
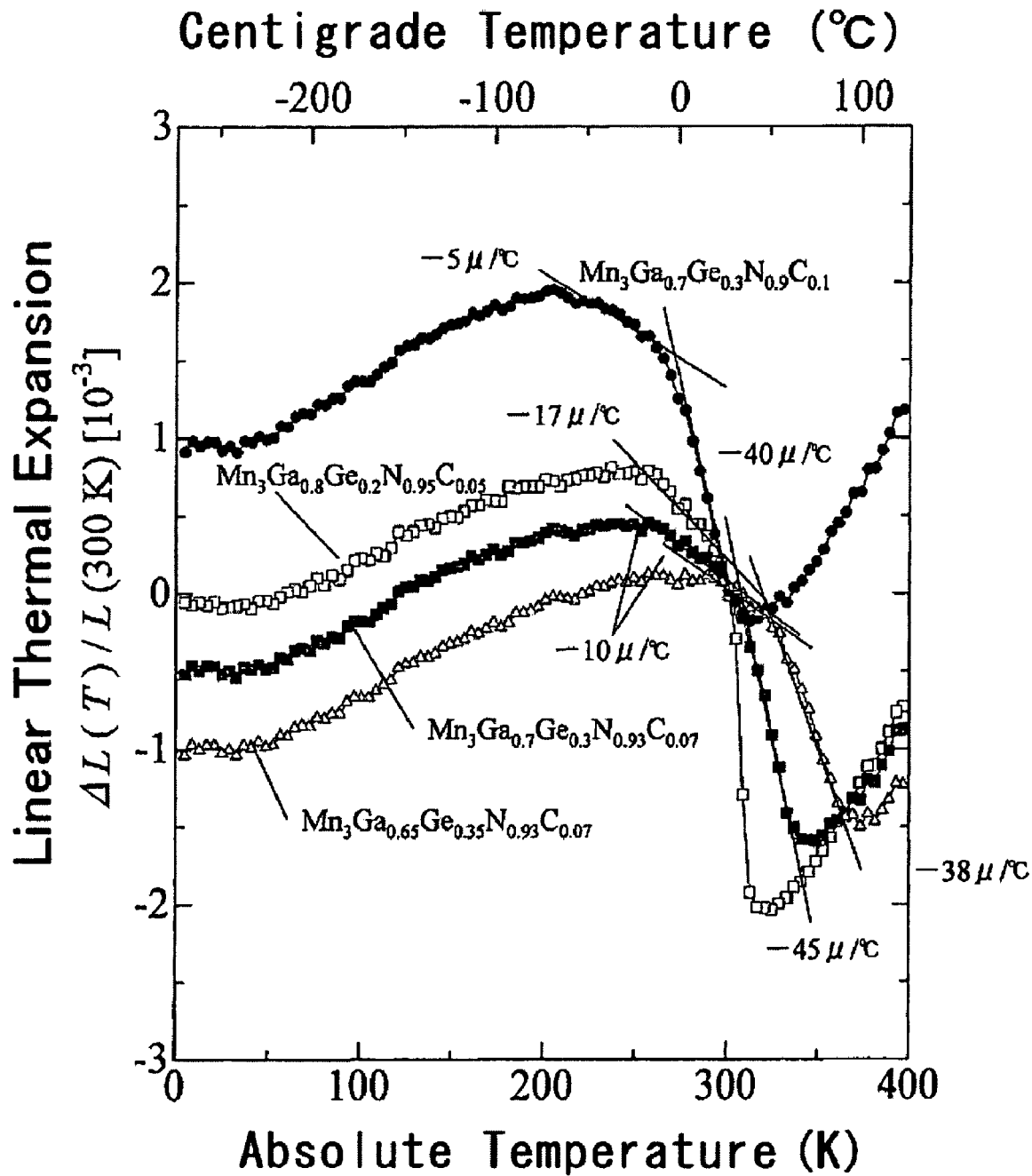
FIG. 8 is a graph showing the effect of another thermal expansion inhibitor of the invention.
Figure 9:
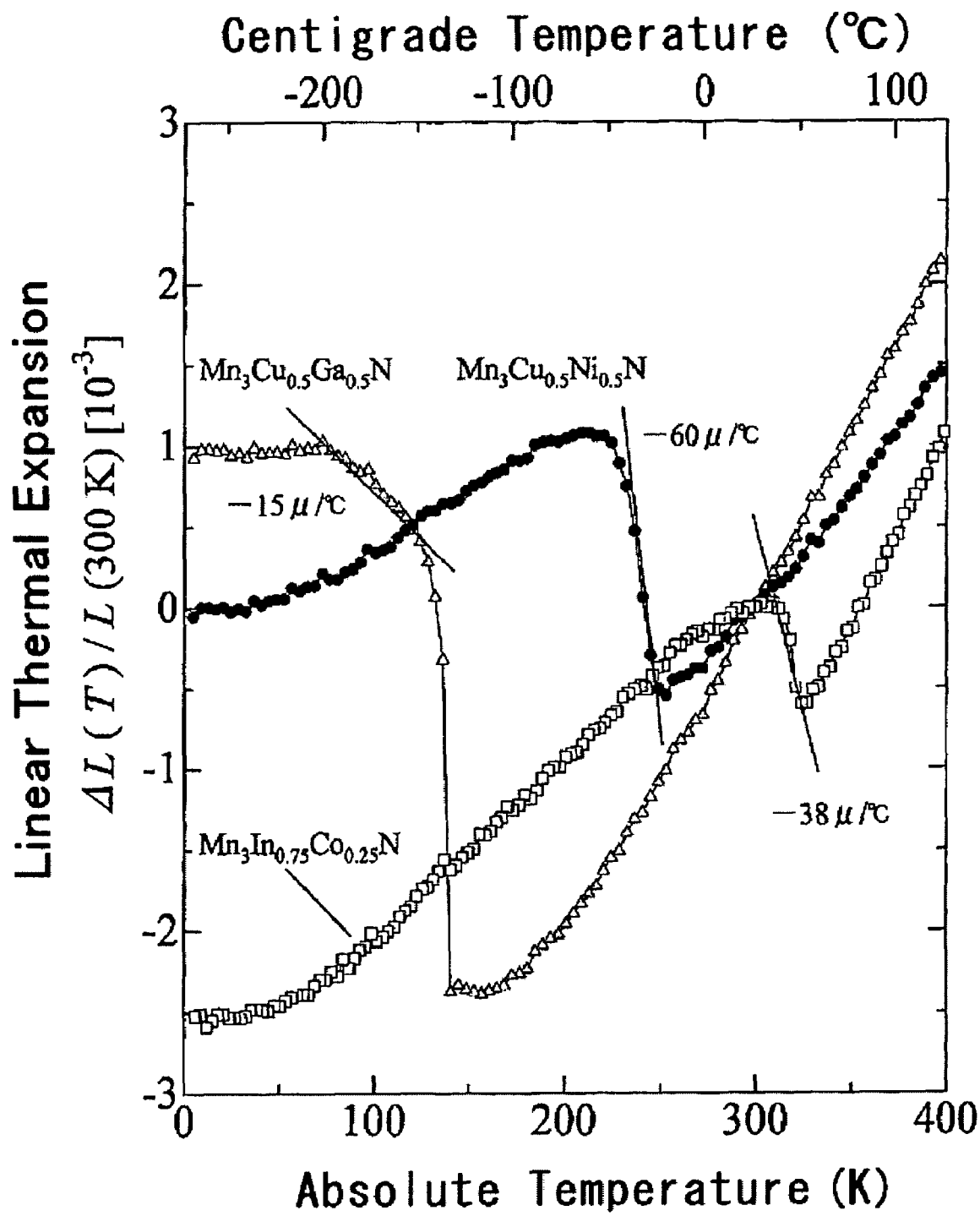
FIG. 9 is a graph showing the effect of another thermal expansion inhibitor of the invention.
Figure 10:
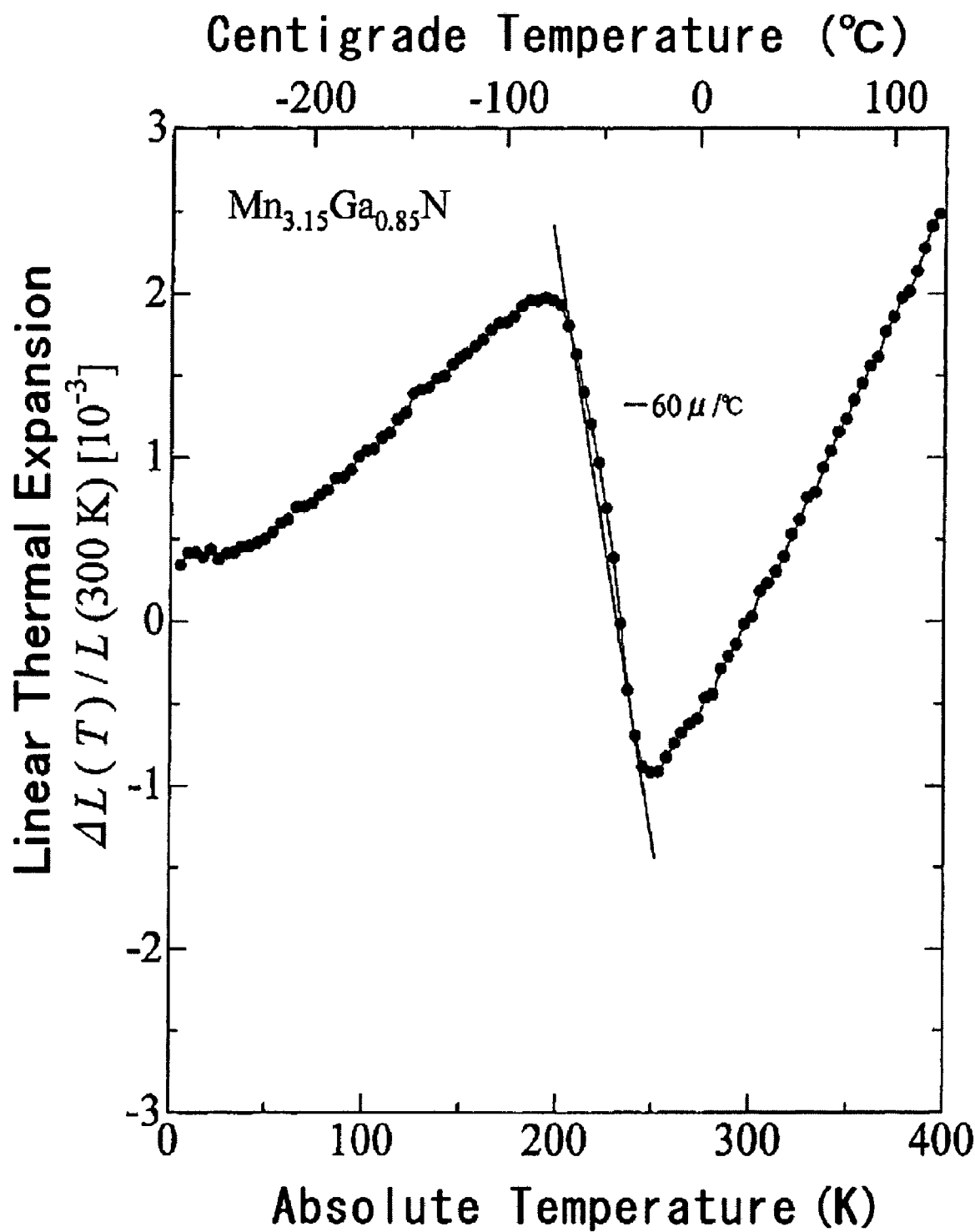
FIG. 10 is a graph showing the effect of another thermal expansion inhibitor of the invention.
Figure 11:
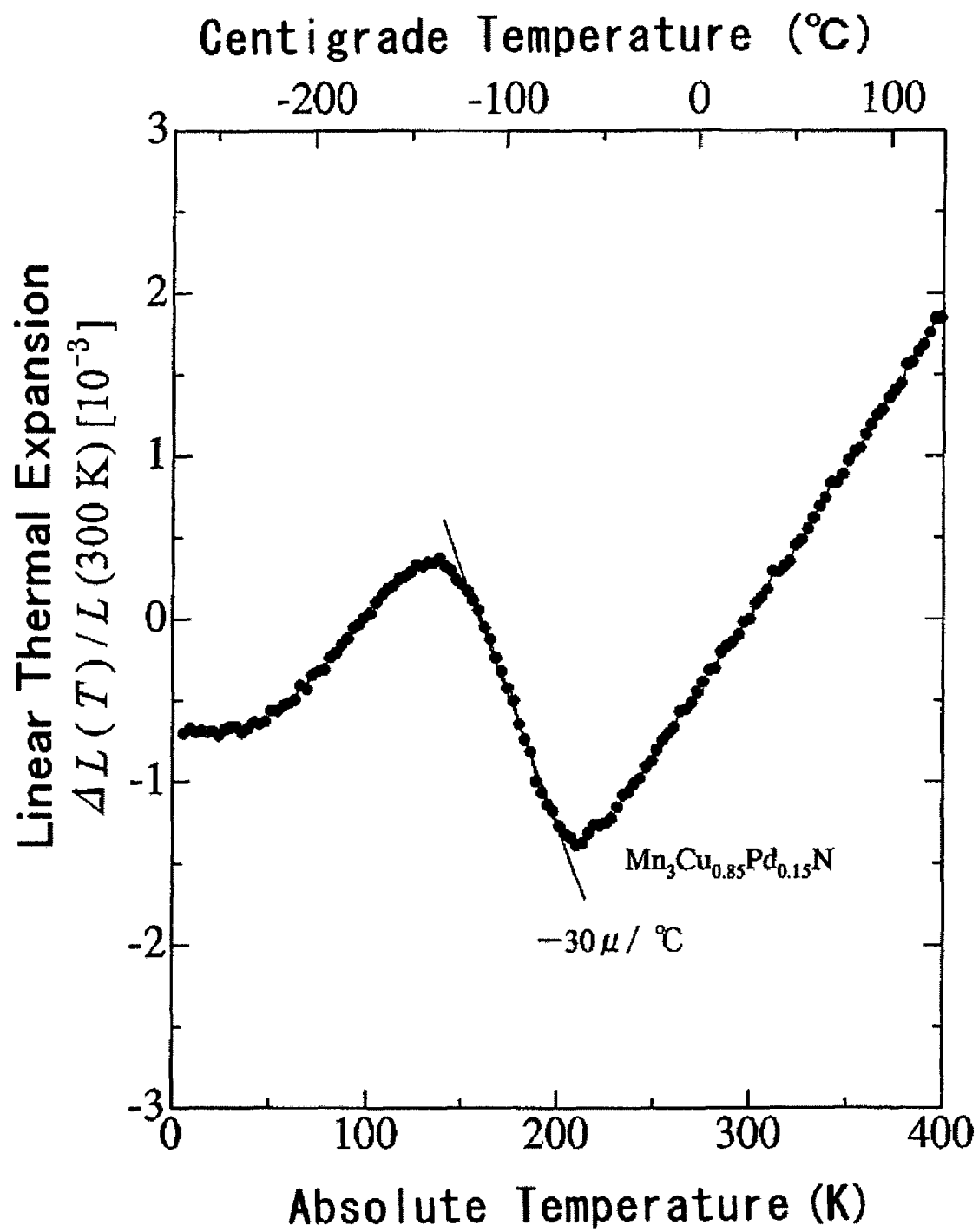
FIG. 11 is a graph showing the effect of another thermal expansion inhibitor of the invention.

FIG. 1 shows the data of the linear thermal expansion of $Mn_3Cu_xGe_{1-x}N$, in which the numeral (0.5, 0.55, 0.6, 0.7) is a value corresponding to x. Similarly, FIG. 2 shows the data of the linear thermal expansion of $Mn_3Cu_xGe_{1-x}N$, in which the numeral (0.45, 0.5) is a value corresponding to x. FIG. 3 to FIG. 11 show the linear thermal expansion of manganese nitrides indicated in the drawings.

In the following Table 1, given are concrete numerical values. Herein, Tmin means the lowest temperature at which the sample began to have a negative coefficient of linear thermal expansion; Tmax means the highest temperature at which the sample was found to surely have a negative coefficient of linear thermal expansion within the temperature range for the test. Accordingly, at least within the temperature range of from Tmin to Tmax (represented by ΔT), the sample should surely have a negative coefficient of linear thermal expansion, but the range is not limitative. Specifically, in this Example, the temperature range for the test is up to 127° C. (400 K), and therefore, though not clear, for example, it may be readily anticipated that Tmax for the negative coefficient of linear thermal expansion of the manganese nitrides in FIG. 2 could be higher than 127° C. (in Table 1, this is shown as *127). Of course, the matter should be taken into consideration that some samples could have a negative coefficient of linear thermal expansion within a temperature range broader than the above-mentioned range of from Tmin to Tmax, owing to experimental errors.

In Table 1, the samples with ($N_2$-8 atm) are the samples subjected to the above-mentioned high-pressure nitrogen treatment.

TABLE 1

| Chemical Formula | Tmin [° C.] | Tmax [° C.] | ΔT [° C.] | Coefficient of linear thermal expansion [μ/° C.] |
|---|---|---|---|---|
| $Mn_3Cu_{0.4}Ge_{0.6}N$ | 78 | *127 | 49 | −2 |
| $Mn_3Cu_{0.45}Ge_{0.55}N$ | 43 | 117 | 74 | −5 |
| $Mn_3Cu_{0.5}Ge_{0.5}N$ | 24 | 93 | 69 | −13 |
| $Mn_3Cu_{0.55}Ge_{0.45}N$ | −15 | 57 | 72 | −15 |
| $Mn_3Cu_{0.6}Ge_{0.4}N$ | −44 | 16 | 60 | −28 |
| $Mn_3Cu_{0.7}Ge_{0.3}N$ | −115 | −65 | 50 | −17 |
| $Mn_3Zn_{0.6}Ge_{0.4}N$ | 51 | 104 | 53 | −30 |
| $Mn_3Ag_{0.75}Ge_{0.25}N$ | −13 | 23 | 36 | −20 |
| $Mn_3In_{0.75}Ge_{0.25}N$ | 100 | *127 | 27 | −12 |
| $Mn_3Ga_{0.65}Ge_{0.35}N$ | 96 | *127 | 31 | −6 |
| $Mn_3Ga_{0.6}Sn_{0.4}N$ | 107 | 127 | 20 | −3 |
| $Mn_3Ga_{0.8}Sn_{0.2}N$ | 44 | 107 | 63 | −14 |
| $Mn_3Cu_{0.5}Sn_{0.5}N$ | 18 | 53 | 35 | −33 |
| $Mn_{2.88}Fe_{0.12}Zn_{0.4}Ge_{0.6}N$ | 84 | *127 | 43 | −7 |
| $Mn_{2.94}Fe_{0.06}Zn_{0.5}Ge_{0.5}N$ | 73 | *127 | 54 | −24 |
| $Mn_{2.88}Fe_{0.12}Zn_{0.5}Ge_{0.5}N$ | 43 | 113 | 70 | −25 |
| $Mn_{2.88}Fe_{0.12}Zn_{0.55}Ge_{0.45}N$ | 27 | 88 | 61 | −40 |
| $Mn_{2.91}Cr_{0.09}GaN$ | −47 | 5 | 52 | −19 |
| $Mn_{2.85}Nb_{0.15}Zn_{0.5}Sn_{0.5}N$ | 104 | *127 | 23 | −2 |
| $Mn_{2.94}Fe_{0.06}Cu_{0.4}Ge_{0.6}N$ | 46 | 112 | 66 | −7 |
| $Mn_{2.85}Ta_{0.15}Cu_{0.6}Ge_{0.4}N$ | −14 | 39 | 53 | −18 |
| $Mn_{3.1}Zn_{0.4}Ge_{0.5}N$ | 61 | 111 | 50 | −13 |
| $Mn_{3.1}Ga_{0.5}Ge_{0.4}N$ | 61 | *127 | 66 | −3 |
| $Mn_{3.1}Ga_{0.6}Ge_{0.3}N$ | 23 | 90 | 67 | −13 |
| $Mn_{3.13}Ga_{0.67}Ge_{0.2}N$ | −32 | 46 | 78 | −32 |
| $Mn_{3.15}Ga_{0.55}Ge_{0.3}N$ | −40 | 17 | 57 | −15 |
| $Mn_{3.17}Ga_{0.63}Ge_{0.2}$ | −92 | −42 | 50 | −36 |
| $Mn_3Ga_{0.8}Ge_{0.2}N_{0.95}C_{0.05}$ | −13 | 43 | 56 | −17 |
| $Mn_3Ga_{0.7}Ge_{0.3}N_{0.93}C_{0.07}$ | −15 | 73 | 88 | −10 to −45 |
| $Mn_3Ga_{0.65}Ge_{0.35}N_{0.93}C_{0.07}$ | 21 | 96 | 75 | −10 to −38 |
| $Mn_3Ga_{0.7}Ge_{0.3}N_{0.9}C_{0.1}$ | −66 | 36 | 102 | −5 to −40 |
| $Mn_3Cu_{0.5}Ga_{0.5}N$ | −194 | −133 | 61 | −15 |
| $Mn_3Cu_{0.5}Ni_{0.5}N$ | −60 | −23 | 37 | −60 |
| $Mn_3In_{0.75}Co_{0.25}N$ | 35 | 52 | 17 | −38 |
| $Mn_{3.15}Ge_{0.85}N$ | −82 | −27 | 55 | −60 |
| $Mn_3Cu_{0.85}Pd_{0.15}N$ | −136 | −63 | 73 | −30 |
| $Mn_3Ga_{0.7}Ge_{0.3}N_{0.88}C_{0.12}$ | −76 | 46 | 122 | −18 |
| $Mn_3Ga_{0.7}Ge_{0.3}N_{0.88}C_{0.12}$ (N2-8tm) | −88 | 6 | 94 | −24 |
| $Mn_3Cu_{0.53}Ge_{0.47}N$ | 0 | 70 | 70 | −14 |
| $Mn_3Cu_{0.53}Ge_{0.47}N$ ($N_2$-8atm) | −85 | −19 | 66 | −32 |

Figure 12:
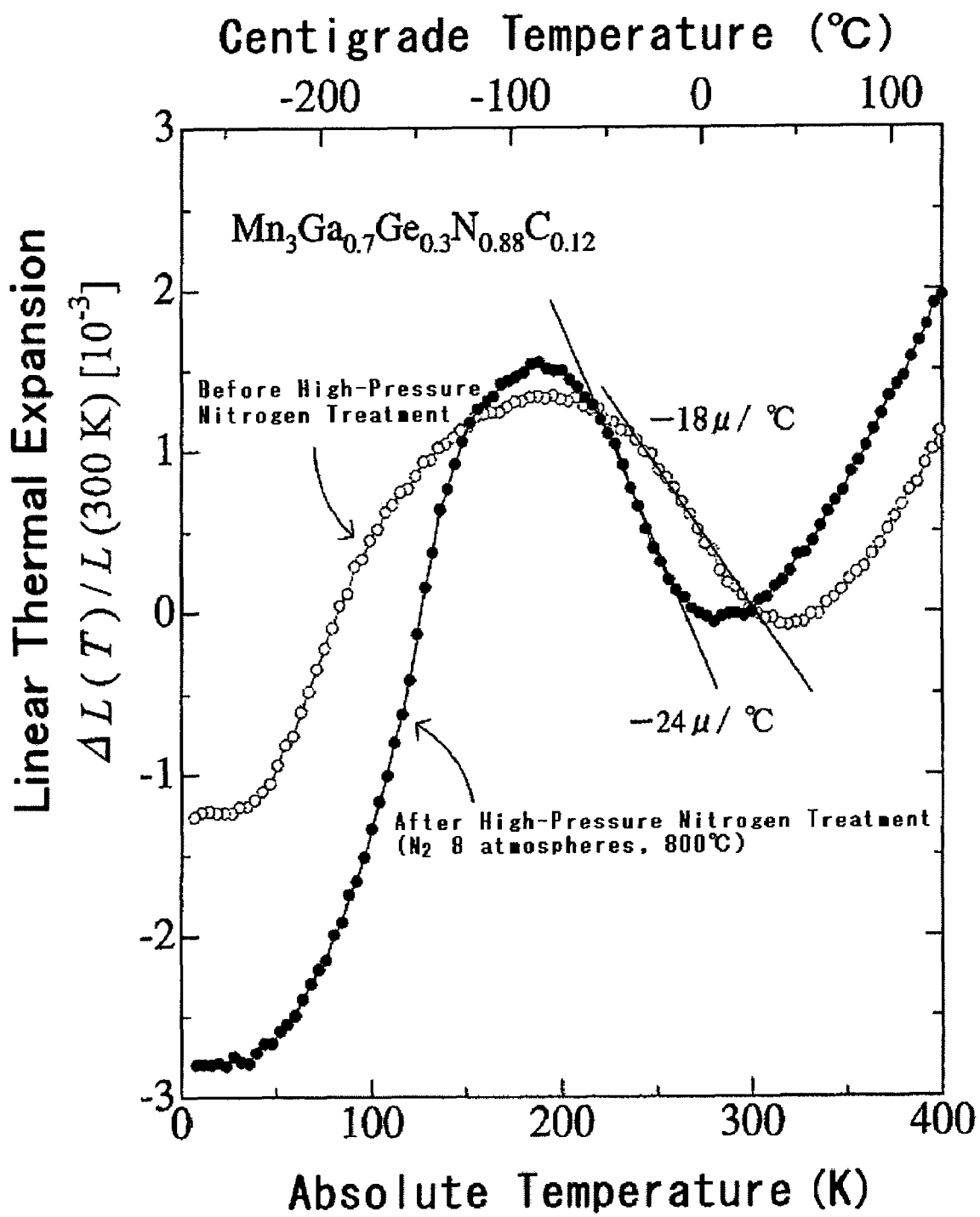
FIG. 12 is a graph showing the effect of another thermal expansion inhibitor (high-pressure nitrogen treatment) of the invention.
Figure 13:
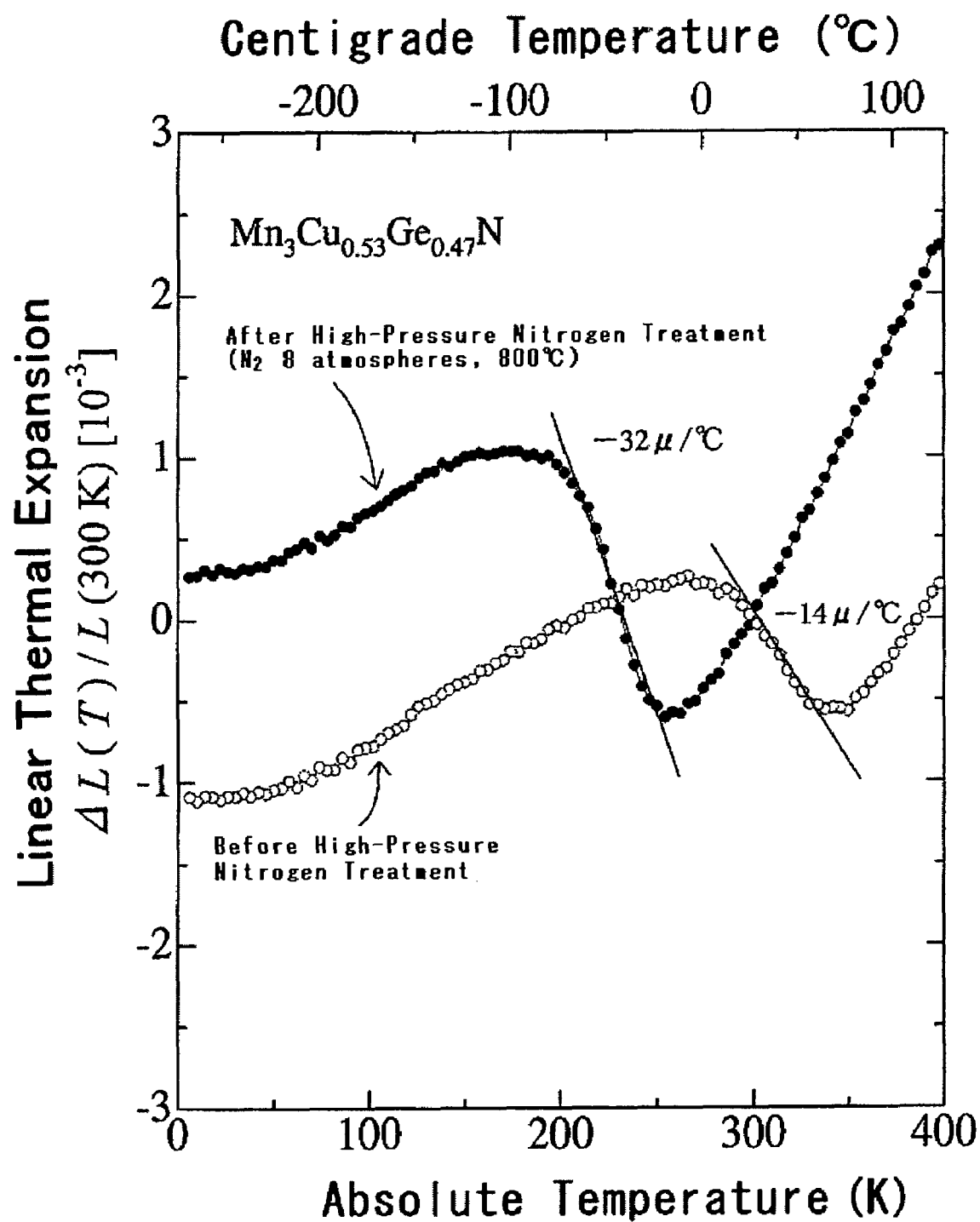
FIG. 13 is a graph showing the effect of another thermal expansion inhibitor (high-pressure nitrogen treatment) of the invention.

As in FIG. 12 and FIG. 13, the high-pressure nitrogen treatment lowered the temperature Tmin. As a result, the region for linear thermal expansion of the treated compounds could be more readily controlled. In addition, the negative thermal expansion of the treated compounds could be enlarged.

INDUSTRIAL APPLICABILITY

The thermal expansion inhibitor of the invention can be utilized as a temperature compensatory material canceling thermal expansion of ordinary materials, and it can be used in producing a negative thermal expansion material that contracts with increasing temperature within a specific temperature range. Further, it can be used in producing a zero thermal expansion material that does not expand positively or negatively within a specific temperature range.

Concretely, it can be utilized for high-precision optical and machinery articles that should be protected from temperature dependence of shape or dimensions, an athermalizer for a fiber grating, printed circuit boards, thermal switches, dental materials, freezing machine parts, etc.

What is claimed is:

1. A thermal expansion inhibitor, which comprises manganese nitride crystals having a composition of the following formula (2), and which has negative thermal expansion over an at least 10° C. range:

$$Mn_{3+x2}A^{21}_{y2}A^{22}_{1-x2-y2}N \quad \text{Formula (2)}$$

wherein $A^{21}$ is one kind of atom selected from the group consisting of Co, Ni, Cu, Zn, Ga, Rh, Pd, Ag, Cd and In, $A^{22}$ is one or more kinds of atoms selected from the group consisting of Al, Si, Sc, and atoms of Groups 4A to 5B of the 4th to 6th Periods of the Periodic Table that are not Mn, in which $A^{21}$ and $A^{22}$ are not the same; $0 \leq x2 < 1$; $0 < y2 < 1$; and $1 > x2+y2$; wherein up to 20% of N in the crystal structure may be substituted with B, C, O, P or S.

2. The thermal expansion inhibitor of claim 1, wherein the manganese nitride has a perovskite structure.

3. The thermal expansion inhibitor of claim 1, which comprises a perovskite manganese nitride crystal obtainable by sintering at least two different kinds of compound shown by the following formula (10), and which has negative thermal expansion over an at least 10° C. range:

$$Mn_3A^1N \quad \text{Formula (10)}$$

wherein A1 is one kind of atom selected from the group consisting of Al, Si, Sc, and atoms of Groups 4A to 5B of the 4th to 6th Periods of the Periodic Table that is not Mn.

4. The thermal expansion inhibitor of claim 1, which comprises a perovskite manganese nitride obtainable by sintering at least $Mn_2N$ and two or more kinds of atoms selected from the group consisting of Al, Si, Sc, atoms of Groups 4A to 5B of 4th to 6th Periods of the Periodic Table that are not Mn and nitrides of said atoms, and which has negative thermal expansion over an at least 10° C. range.

5. The thermal expansion inhibitor of claim 1, which has a coefficient of linear thermal expansion of from $-100 \times 10^{-6}/°C.$ to $-3 \times 10^{-6}/°C.$ 6. The thermal expansion inhibitor of claim 1, which has negative thermal expansion over an at least 15° C. range.

7. The thermal expansion inhibitor of claim 1, wherein the nitrogen atom in the manganese nitride is substituted with an atom selected from the group consisting of B, C, O, P or S in a ratio such that 0<ratio<15%.

8. A thermal expansion inhibitor, which comprises a manganese nitride crystal having a composition of the following formula (2-2):

$$Mn_{3+x2}A^{21}_{y2}A^{22}_{1-x2-y2}N \quad \text{Formula (2)}$$

Wherein $A^{21}$ is one kind of atom selected from the group consisting of Co, Ni, Cu, Zn, Ga, Rh, Pd, Ag, Cd and In, $A^{22}$ is one or more kinds of atoms selected from the group consisting of Co, Ni, Cu, Zn, Ga, Rh, Pd, Ag, Cd, In, Ge, and Sn, in which $A^{21}$ and $A^{22}$ are not the same; $0 \leq x2 < 1$; $0.35 < y2 < 0.8$; and $1 > x2+y2$; wherein up to 20% of N in the crystal structure may be substituted with B, C, O, P or S.

9. A thermal expansion inhibitor, which comprises a manganese nitride crystal having a composition of the following formula (2-3):

$$Mn_{3+x2}A^{21}_{y2}A^{22}_{1-x2-y2}N \quad \text{Formula (2-3)}$$

Wherein $A^{21}$ is one kind of atom selected from the group consisting of Ni, Cu, Zn, Ga, Ag, and In, $A^{22}$ is either Ge or Sn, x2 is 0; $0.35 < y2 < 0.8$, and $1 > x2+y2$; wherein up to 20% of N in the crystal structure may be substituted with B, C, O, P or S.

10. A thermal expansion inhibitor, which comprises a manganese nitride crystal having a composition of the following formula (2-4):

$$Mn_{3+x2}A^{21}_{y2}A^{22}_{1-x2-y2}N \quad \text{Formula (2-4)}$$

Wherein $A^{21}$ is one kind of atom selected from the group consisting of Ni, Cu, Zn, Ga, Ag, Cd, and In, $A^{22}$ is either Ge or Sn, in which $A^{21}$ and $A^{22}$ are not the same and are not Mn; $0 < x2$; $0.35 < y2 < 0.7$; wherein up to 20% of N in the crystal structure may be substituted with B, C, O, P or S.

11. A thermal expansion inhibitor, which comprises manganese nitride crystals having a composition of the following formula (3), and which has negative thermal expansion over an at least 10° C. range:

$$Mn_{3+x3}A^{31}_{y3}A^{32}_{1-x3-y3}N \quad \text{Formula (3)}$$

Wherein $A^{31}$ is one kind of atom selected from the group consisting of Co, Ni, Cu, Zn, Ga, Rh, Pd, Ag, Cd, and In, $A^{32}$ consists of one or more atoms kinds of atoms selected from the group consisting of Al, Si, Sc, and atoms of Groups 4A to 5B of the 4th to 6th Periods of the Periodic Table that are not Mn, in which $A^{31}$ and $A^{32}$ are not the same; $0 < x3 < 1$; $0 < y3 < 2$; and $1+x3-y3 > 0$; wherein up to 20% of N in the crystal structure may be substituted with B, C, O, P or S.

12. A thermal expansion inhibitor, which comprises a manganese nitride crystal having a composition of the following formula (4):

$$Mn_{3-x4}A^{41}_{y4}A^{42}_{1-y4}A^{43}_{x4}N \quad \text{Formula (4)}$$

Wherein $A^{41}$ is one kind of atom selected from the group consisting of Co, Ni, Cu, Zn, Ga, Rh, Pd, Ag, Cd, and In, $A^{42}$ is one or more kinds of atoms selected from the group consisting of Co, Ni, Cu, Zn, Ga, Rh, Pd, Ag, Cd, In, Ge, and Sn, in which $A^{41}$ and $A^{42}$ are not the same; $A^{43}$ is one kind of atom selected from the group consisting of Fe, Ta, Cr, and Nb; $0 < x4 < 0.3$, and $0.35 < y4 < 0.8$; wherein up to 20% of N in the crystal structure may be substituted with B, C, O, P or S.

13. A thermal expansion inhibitor, which comprises a manganese nitride crystal having a composition of the following formula (4-2):

$$Mn_{3-x4}A^{41}_{y4}A^{42}_{1-y4}A^{43}_{x4}N \quad \text{Formula (4-2)}$$

Wherein $A^{41}$ is one kind of atom selected from the group consisting of Ni, Cu, Zn, Ga Ag and In, $A^{42}$ is either Ge or Sn; $A^{43}$ is one kind of atom selected from Fe or Ta; $0 < x4 < 0.3$, and $0.35 < y4 < 0.8$; wherein up to 20% of N in the crystal structure may be substituted with B, C, O, P or S.

* * * * *